US012677486B2

(12) United States Patent
Hsieh et al.

(10) Patent No.:     US 12,677,486 B2
(45) Date of Patent:     Jul. 7, 2026

(54) IMAGE SENSOR DEVICES AND METHODS OF FORMATION

(71) Applicant: Taiwan Semiconductor Manufacturing Company, Ltd., Hsinchu (TW)

(72) Inventors: Feng-Chien Hsieh, Pingtung City (TW); Yun-Wei Cheng, Taipei City (TW); Wei-Li Hu, Tainan City (TW); Kuo-Cheng Lee, Tainan City (TW); Cheng-Ming Wu, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 512 days.

(21) Appl. No.: 18/320,066

(22) Filed: May 18, 2023

(65) Prior Publication Data
US 2024/0387596 A1     Nov. 21, 2024

(51) Int. Cl.
H10F 39/18          (2025.01)
H10F 39/00          (2025.01)

(52) U.S. Cl.
CPC ........... H10F 39/18 (2025.01); H10F 39/014 (2025.01); H10F 39/8037 (2025.01); H10F 39/807 (2025.01); H10F 39/811 (2025.01)

(58) Field of Classification Search
CPC .... H10F 39/18; H10F 39/014; H10F 39/8037; H10F 39/807; H10F 39/811; H10F 39/199; H01L 27/14689; H01L 27/14636; H01L 27/14643; H01L 27/1464; H01L 27/1463; H01L 27/14612
See application file for complete search history.

(56) References Cited

U.S. PATENT DOCUMENTS

| | | | | |
|---|---|---|---|---|
| 10,134,790 B1 * | 11/2018 | Wu | ......................... | H10F 39/026 |
| 2008/0142990 A1 * | 6/2008 | Yu | ......................... | H10D 84/038 |
| | | | | 438/109 |
| 2014/0070348 A1 * | 3/2014 | Yee | ..................... | H10F 39/8053 |
| | | | | 257/E31.127 |
| 2014/0263959 A1 * | 9/2014 | Hsu | ......................... | H10F 39/014 |
| | | | | 250/206 |
| 2016/0020235 A1 * | 1/2016 | Yamashita | ............ | H10F 39/811 |
| | | | | 250/206 |
| 2018/0182794 A1 * | 6/2018 | Go | ......................... | H10F 39/8037 |
| 2021/0014444 A1 * | 1/2021 | Geurts | ................... | H04N 25/78 |

* cited by examiner

*Primary Examiner* — William B Partridge
*Assistant Examiner* — David Paul Sedorook
(74) *Attorney, Agent, or Firm* — Harrity & Harrity, LLP

(57)          ABSTRACT

An image sensor device may include a pixel sensor array that includes a plurality of pixel sensors. A plurality of transistors may be electrically connected with a back end of line (BEOL) region of the image sensor device. The image sensor device may further include a bonding pad region in which a bonding pad is included. A dielectric plug may surround a portion of the bonding pad and may fully extend through a semiconductor device region to provide electrical, thermal, and/or optical isolation for the pixel sensors of the pixel sensor array. Additionally and/or alternatively, one or more capacitors in the BEOL region of the image sensor device. The one or more capacitors may enable a photocurrent generated by one or more of the pixel sensors to be directly transferred from the one or more source follower transistors to the one or more capacitors for storage.

20 Claims, 31 Drawing Sheets

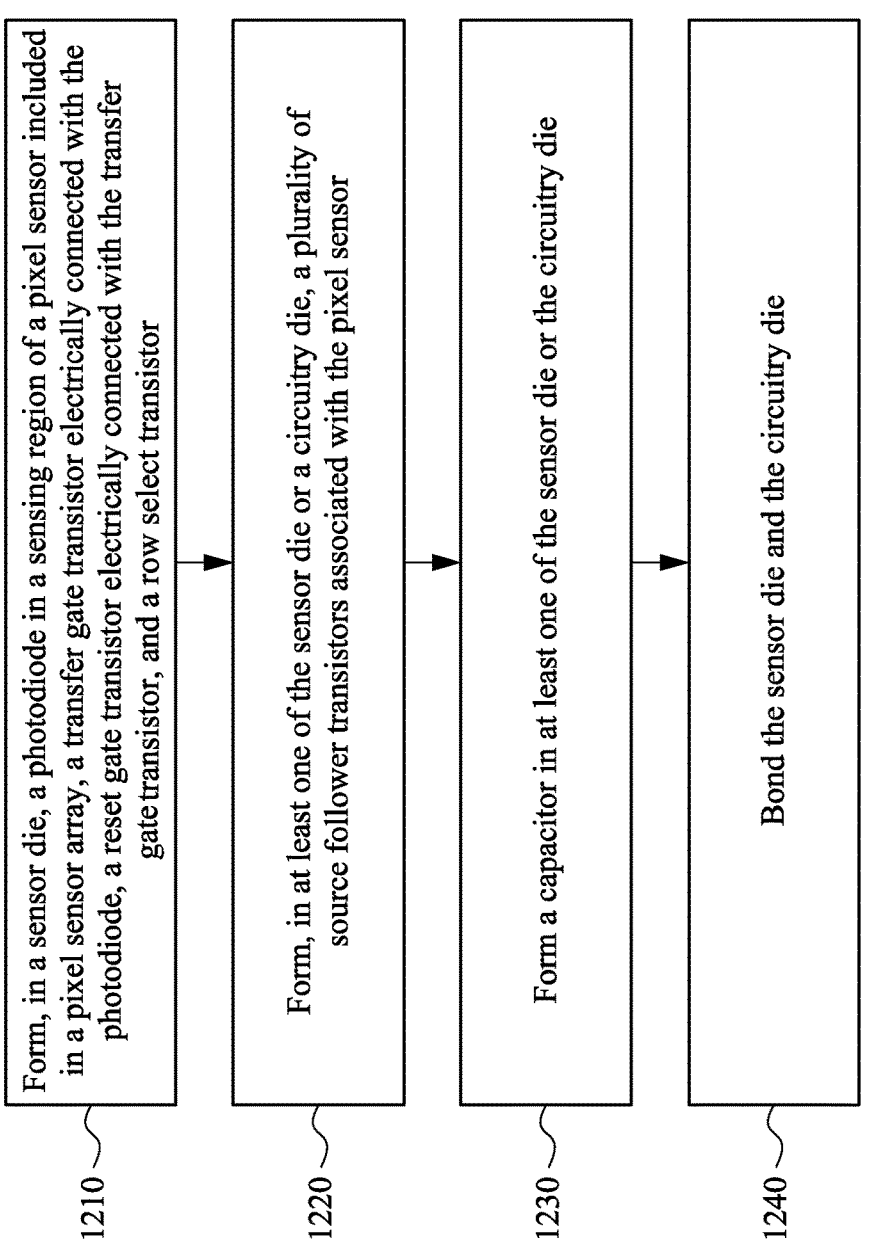

1200

1210 — Form, in a sensor die, a photodiode in a sensing region of a pixel sensor included in a pixel sensor array, a transfer gate transistor electrically connected with the photodiode, a reset gate transistor electrically connected with the transfer gate transistor, and a row select transistor 1220 — Form, in at least one of the sensor die or a circuitry die, a plurality of source follower transistors associated with the pixel sensor 1230 — Form a capacitor in at least one of the sensor die or the circuitry die 1240 — Bond the sensor die and the circuitry die

Fig. 12

IMAGE SENSOR DEVICES AND METHODS OF FORMATION

BACKGROUND

A complementary metal oxide semiconductor (CMOS) image sensor may include a plurality of pixel sensors. A pixel sensor of the CMOS image sensor may include a transfer gate transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is a flowchart of an example process associated with forming an image sensor device.

DETAILED DESCRIPTION

Figure 1:
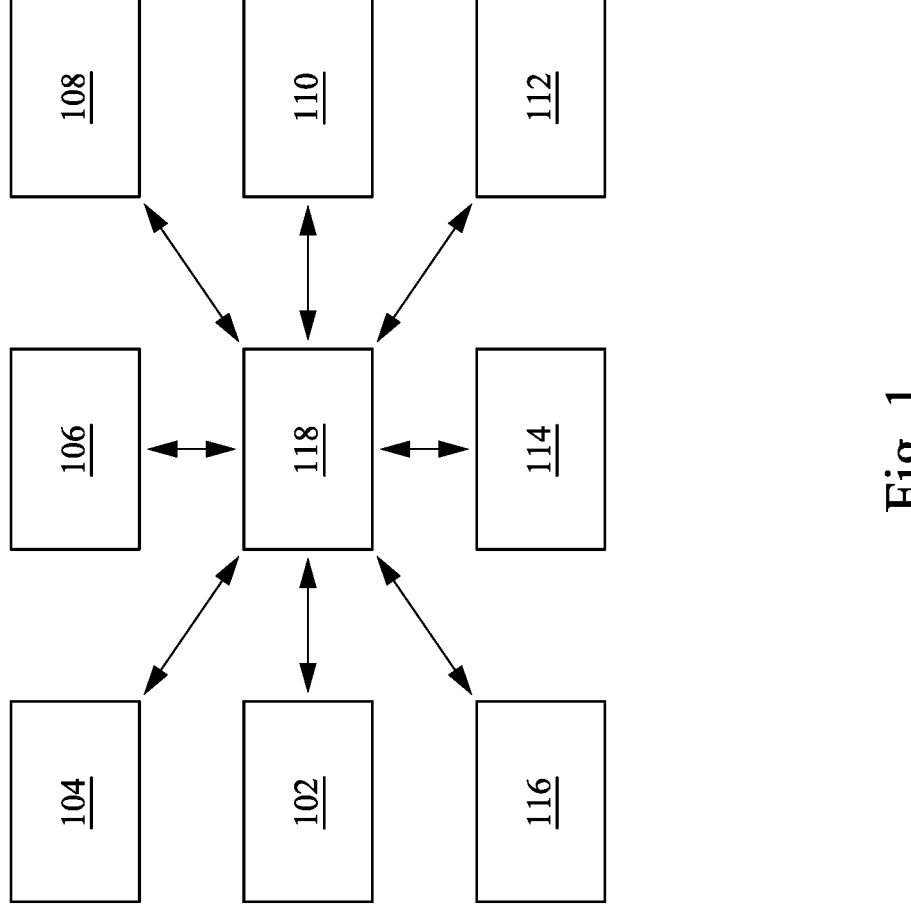
FIG. 1 is a diagram of an example environment in which systems and/or methods described herein may be implemented.
Figure 1:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, an image sensor device (e.g., a complementary metal oxide semiconductor (CMOS) image sensor (CIS) device) may include a pixel sensor array that includes one or more pixel sensors. A pixel sensor may include a plurality of transistors that are configured to transfer a photocurrent, generated by the pixel sensor, to circuitry of the image sensor device for measurement so that an image and/or a video may be generated based on results of the measurement. The plurality of transistors may include, for example, a transfer gate transistor, a source follower transistor, and/or a row select transistor, among other examples. The transfer gate transistor may transfer a photocurrent generated by the pixel sensor to the source follower transistor, which amplifies the photocurrent. The row select transistor may control the flow of the photocurrent to external circuitry of the image sensor device.

The pixel sensors in image sensor device may be susceptible to electrical, thermal, and/or optical noise, which may reduce the quality of images and/or video generated based on photocurrents generated by the pixel sensors. For example, electrical, thermal, and/or optical noise (e.g., dark current, optical and/or electrical crosstalk, optical flares) may introduce visual artifacts (e.g., white/hot pixels, inaccurate color representation, low light noise) that reduce the quality of images and/or video generated based on photocurrents generated by the pixel sensors.

In some cases, isolation structures may be included in one or more regions of the image sensor device to reduce the electrical, thermal, and/or optical noise experienced by the pixel sensors. For example, a shallow trench isolation (STI) region may be included in a silicon (Si) substrate of the image sensor device. The STI region may be included in a bonding pad region of the image sensor device to isolate a bonding pad of the image sensor device, which may reduce and/or prevent ingress of electrical and/or optical noise from the bonding pad from reaching and affecting the performance of the pixel sensors.

However, the STI region may occupy a large amount of lateral area in the silicon substrate of the image sensor device. This reduces the amount of area in the image sensor device that may be used for the transistors of the pixel sensors of the image sensor device. As a result, the size of one or more of the transistors may need to be reduced in order to fit all of the transistors in the pixel sensor array. However, reducing the size of one or more of the transistors may result in reduced performance for one or more of the transistors. For example, reducing the size of the source follower transistor may result in reduced signal amplification for the source follower transistor, which can increase the levels of noise and/or dark current in the photocurrent, among other examples.

In some implementations described herein, an image sensor device may include a pixel sensor array that includes a plurality of pixel sensors. Under the pixel sensors, a plurality of transistors may be included and electrically connected with a back end of line (BEOL) region of the image sensor device. The plurality of transistors may include a transfer gate transistor, a reset gate transistor, source follower transistor, a row select transistor, and/or another transistor that is used to control the operation of the pixel sensors.

The image sensor device may further include a bonding pad region in which a bonding pad is included. Instead of including an STI region to electrically and/or optically isolate the bonding pad, a dielectric plug may be included, where the dielectric plug surrounds a portion of the bonding pad and fully extends through a semiconductor device region (e.g., a silicon (Si) substrate and/or another type of semiconductor device region) to provide electrical, thermal, and/or optical isolation for the pixel sensors of the pixel sensor array. The inclusion of the dielectric plug may provide increased electrical, thermal, and/or optical isolation relative to an STI region, while occupying a smaller lateral area relative to the STI region. The smaller lateral area of the dielectric plug enables a greater amount of lateral area in the semiconductor device region to be used for the transistors of the pixel sensors of the image sensor device. This enables one or more of the transistors to be formed to a greater size, which may enable greater performance to be achieved for the one or more transistors. For example, the smaller lateral area of the dielectric plug enables a greater amount of lateral area in the semiconductor device region to be used for the source follower transistor, which may enable the size of the source follower transistors to be increased and/or may enable a plurality of source follower transistors to be included in the image sensor device. The increased size and/or increased quantity of source follower transistors may enable increase photocurrent amplification, which may reduce noise and increase image quality in photos and/or video generated by the image sensor device.

Additionally and/or alternatively, in some implementations described herein, one or more capacitors in the BEOL region of the image sensor device. A capacitor may perform and/or support one or more functions in the image sensor device, such as photocurrent storage, shutter operation, increasing capacitance per unit area for pixel sensors of the image sensor device, and/or another function. One or more capacitors may be included in the BEOL region and may be electrically connected with one or more of the transistors. For example, the one or more capacitors may be electrically connected with one or more source follower transistors, which enables a photocurrent generated by one or more of the pixel sensors to be directly transferred from the one or more source follower transistors to the one or more capacitors for storage.

In some implementations, the one or more capacitors in the image sensor device may be configured to support the operation of a shutter associated with the image sensor device. A shutter is a component that enables selective exposure of pixel sensors in a pixel sensor array of the image sensor device to light. Shutters are often included in digital cameras to enable the capture of discrete images or photographs. The capacitor may enable the use of a "global shutter" technique or a "total shutter" technique, where the entire pixel sensor array is exposed simultaneously. At the start of a global shutter exposure operation, each pixel sensor in the pixel sensor array may begin to accumulate a charge due to exposure to light. The charge may be stored in the capacitor and transferred to a readout circuit at the end of the global shutter exposure operation.

In this way, the one or more capacitors in the BEOL region of the image sensor device may facilitate advanced shutter techniques to be use by the image sensor device, which may reduce latency in the generation of images and/or video by the image sensor device, which may increase the low-light performance of the image sensor device. Moreover, facilitating the transfer of photocurrents directly from the source follower transistor(s) to the capacitor(s) may reduce the amount of noise in the video generated by the image sensor device, thereby increasing the quality of images and/or video generated by the image sensor device.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, a bonding tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an anode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The bonding tool 116 is a semiconductor processing tool that is capable of bonding two or more wafers (or two or more semiconductor substrates, or two or more semiconductor devices) together. For example, the bonding tool 116 may include a eutectic bonding tool that is capable of forming a eutectic bond between two or more wafers together. In these examples, the bonding tool 116 may heat the two or more wafers to form a eutectic system between the materials of the two or more wafers. As another example, the bonding tool 116 may include a hybrid bonding tool, a direct bonding tool, and/or another type of bonding tool.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a pixel sensor in a sensor die; may form a sensing region that includes a photodiode in a device region of the sensor die; may form a control circuitry region below the device region, that includes a transfer gate transistor; may form a reset gate transistor electrically connected with the transfer gate transistor; may form a plurality of source follower transistors electrically connected with the transfer gate transistor and the reset gate transistor; may form a capacitor electrically connected with the plurality of source follower transistors; may form a row select transistor electrically connected with the capacitor; may form a circuitry die; and/or may bond the sensor die with the circuitry die, among other examples.

As another example, one or more of the semiconductor processing tools 102-116 and/or the wafer/die transport tool 118 may form, in a sensor die, a photodiode in a sensing region of a pixel sensor included in a pixel sensor array; may form a transfer gate transistor, included in a first control circuitry region of the sensor die, electrically connected with the photodiode; may form a reset gate transistor, included in the first control circuitry region, electrically connected with the transfer gate transistor; may form a row select transistor included in the first control circuitry region; may form, in a circuitry die, a plurality of source follower transistors included in a second control circuitry region associated with the pixel sensor; may form a capacitor in at least one of the sensor die or the circuitry die, where the capacitor is electrical connected with the row select transistor and the plurality of source follower transistors; and/or may bond the sensor die and the circuitry die, among other example.

As another example, one or more of the semiconductor processing tools 102-116 and/or the wafer/die transport tool 118 may form a sensor die, a pixel sensor that includes a sensing region that includes a photodiode in a device region of the sensor die; may form a first control circuitry region, below the sensing region, a transfer gate transistor, a reset gate transistor electrically connected with the transfer gate transistor, a plurality of source follower transistors electrically connected with the transfer gate transistor and the reset gate transistor, and a row select transistor; may form a second control circuitry region, that includes a capacitor electrically connected with the plurality of source follower transistors and the row select transistor, where the capacitor is configured to store a photocurrent received from the plurality of source follower transistors; and/or may bond the sensor die with the circuitry die, among other examples.

In some implementations, one or more of the semiconductor processing tools 102-116 and/or the wafer/die transport tool 118 may perform one or more semiconductor processing operations described in connection with FIGS. 6A-6R and/or 12, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
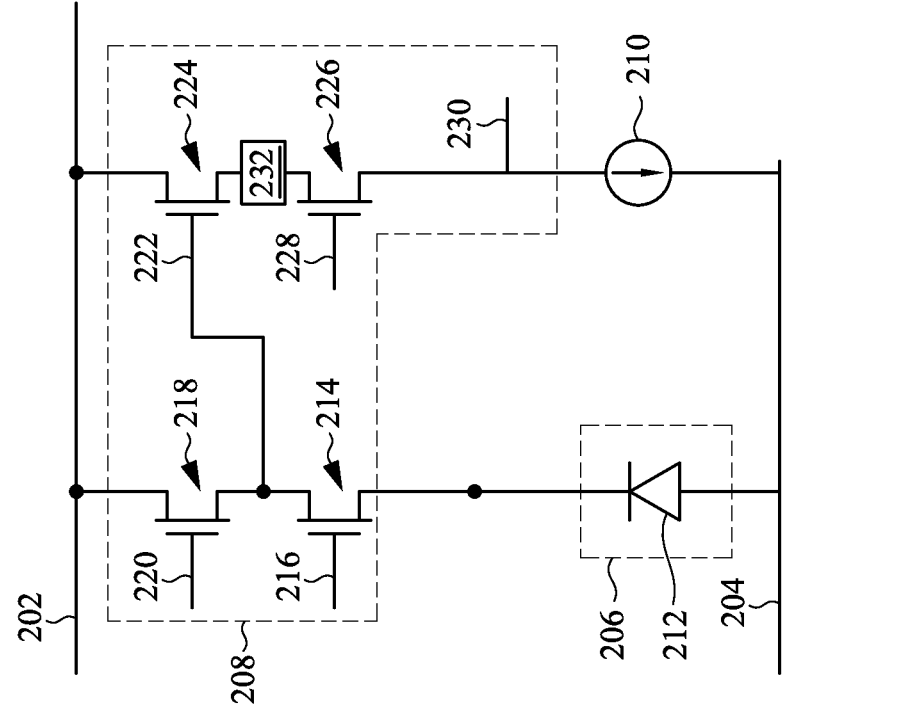
FIG. 2 is a diagram of an example of a pixel sensor described herein.

FIG. 2 is a diagram of an example of a pixel sensor 200 described herein. The pixel sensor 200 may include a front side pixel sensor (e.g., a pixel sensor that is configured to receive photons of light from a front side of a sensor die), a back side pixel sensor (e.g., a pixel sensor that is configured to receive photons of light from a back side of a sensor die), and/or another type of pixel sensor. The pixel sensor 200 may be electrically connected to a supply voltage ($V_{dd}$) 202 and an electrical ground 204.

The pixel sensor 200 includes a sensing region 206 that may be configured to sense and/or accumulate incident light (e.g., light directed toward the pixel sensor 200). The pixel sensor 200 also includes a control circuitry region 208. The control circuitry region 208 is electrically connected with the sensing region 206 and is configured to receive a photocurrent 210 that is generated by the sensing region 206. Moreover, the control circuitry region 208 is configured to transfer the photocurrent 210 from the sensing region 206 to downstream circuits such as amplifiers or analog-to-digital (AD) converters, among other examples.

The sensing region 206 includes a photodiode 212. The photodiode 212 may absorb and accumulate photons of the incident light, and may generate the photocurrent 210 based on absorbed photons. The magnitude of the photocurrent 210 is based on the amount of light collected in the photodiode 212. Thus, the accumulation of photons in the photodiode 212 generates a build-up of electrical charge that represents the intensity or brightness of the incident light (e.g., a greater amount of charge may correspond to a greater intensity or brightness, and a lower amount of charge may correspond to a lower intensity or brightness).

The photodiode 212 is electrically connected with a source of a transfer gate transistor 214 in the control circuitry region 208. The transfer gate transistor 214 is configured to control the discharge of the photocurrent 210 from the photodiode 212. The photocurrent 210 is provided from the source of the transfer gate transistor 214 to a drain of the transfer gate transistor 214 based on selectively switching a gate of the transfer gate transistor 214. The gate of the transfer gate transistor 214 may be selectively switched by applying a transfer voltage ($V_{tx}$) 216 to the gate of the transfer gate transistor 214. In some implementations, the transfer voltage 216 being applied to the gate of the transfer gate transistor 214 causes a conductive channel to form between the source and the drain of the transfer gate transistor 214, which enables the photocurrent 210 to traverse along the conductive channel from the source to the drain. In some implementations, the transfer voltage 216 being removed from the gate (or the absence of the transfer voltage 216) causes the conductive channel to be removed such that the photocurrent 210 cannot pass from the source to the drain.

The control circuitry region 208 further includes a reset gate transistor 218. The reset gate transistor 218 is electrically connected to the supply voltage 202 and to the drain of the transfer gate transistor 214. The reset gate transistor 218 is configured to pull the drain of the transfer gate transistor 214 to a high voltage (e.g., to the supply voltage 202) to "reset" the control circuitry region 208 prior to activation of the transfer gate transistor 214 to read the photocurrent 210 from the photodiode 212. The reset gate transistor 218 may be controlled by a reset voltage ($V_{rst}$) 220.

The output from the drain of the transfer gate transistor 214 is electrically connected by a floating diffusion node 222 with a gate of a source follower transistor 224. The output from the transfer gate transistor 214 is provided to the gate of the source follower transistor 224 by the floating diffusion node 222, which applies a floating diffusion voltage ($V_{fd}$) to the gate of the source follower transistor 224. This permits the photocurrent 210 to be observed without removing or discharging the photocurrent 210 from the floating diffusion node 222. The reset gate transistor 218 is instead used to remove or discharge the photocurrent 210 from the floating diffusion node 222.

The source follower transistor 224 functions as a high impedance amplifier for the pixel sensor 200. The source follower transistor 224 provides a voltage to current conversion of the floating diffusion voltage. The output of the source follower transistor 224 is electrically connected with a row select transistor 226, which is configured to control the flow of the photocurrent 210 to external circuitry. The row select transistor 226 is controlled by selectively applying a select voltage ($V_{di}$) 228 to the gate of the row select transistor 226. This permits the photocurrent 210 to flow to an output 230 of the pixel sensor 200.

As further shown in FIG. 2, a capacitor 232 may store the photocurrent 210 that is outputted from the source follower transistor 224. The capacitor 232 may store the photocurrent 210 prior to activation of the row select transistor 226. Activation of the row select transistor 226 may cause the photocurrent 210 stored in the capacitor 232 to be discharged to the output 230.

As described herein, one or more transistors 214, 218, 224, and/or 226, and/or the capacitor 232, of the control circuitry region 208 of the pixel sensor 200 may be included in separate dies of a stacked image sensor device such as a 3D CMOS image sensor (3DCIS) device. This may enable the size of the source follower transistor 224 to be increased and/or may enable a greater quantity of source follower transistors 224 to be included in the pixel sensor 200. The increased size and/or increased quantity of the source follower transistors 224 may improve the amplification of the photocurrent 210 by reducing noise in the photocurrent 210 as amplified and/or by increasing the amplitude of the photocurrent 210 as amplified, among other examples.

As indicated above, FIG. 2 is provided as an example. Other examples may differ from what is described with regard to FIG. 2.

Figure 3A:
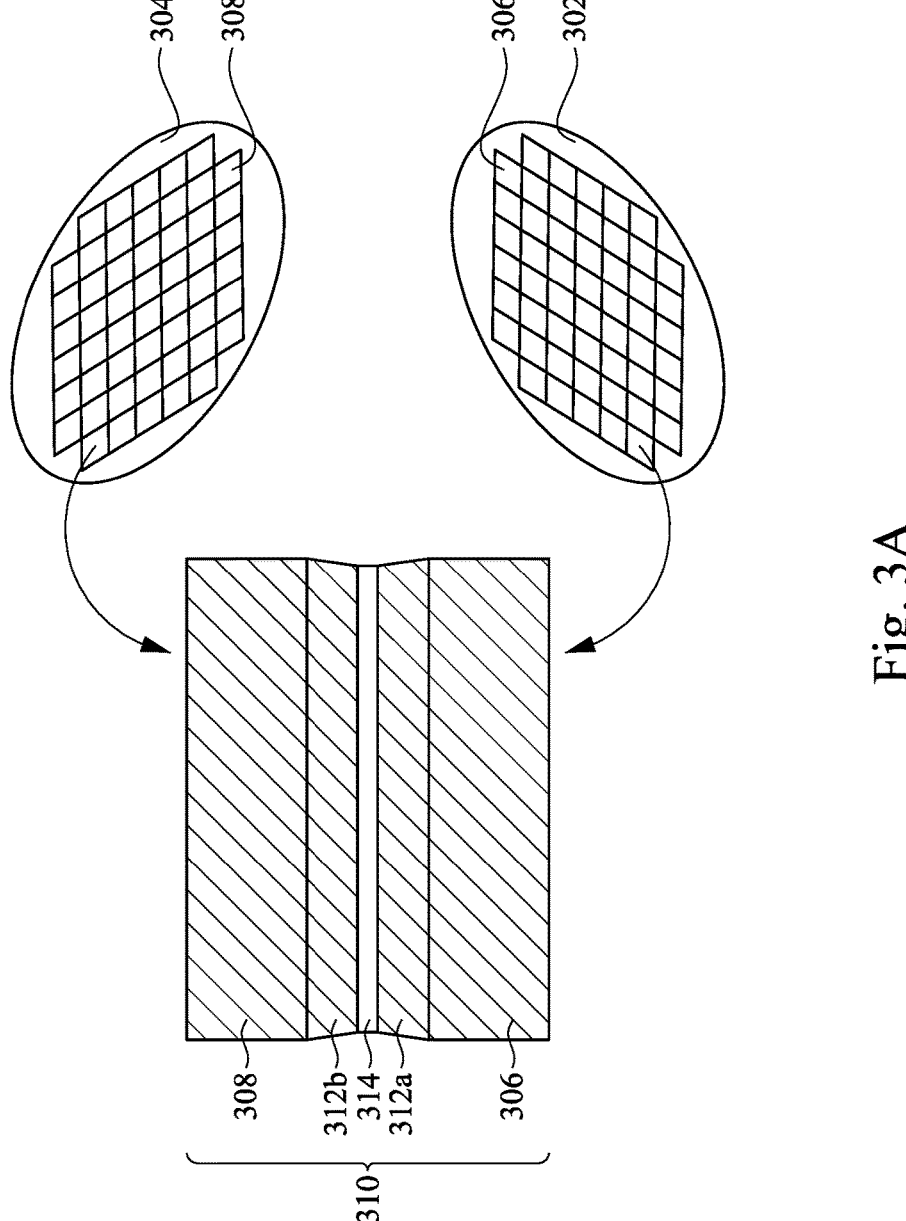
FIGS. 3A-3C are diagrams of examples of a stacked image sensor device described herein.
Figure 3A:
Figure 3B:
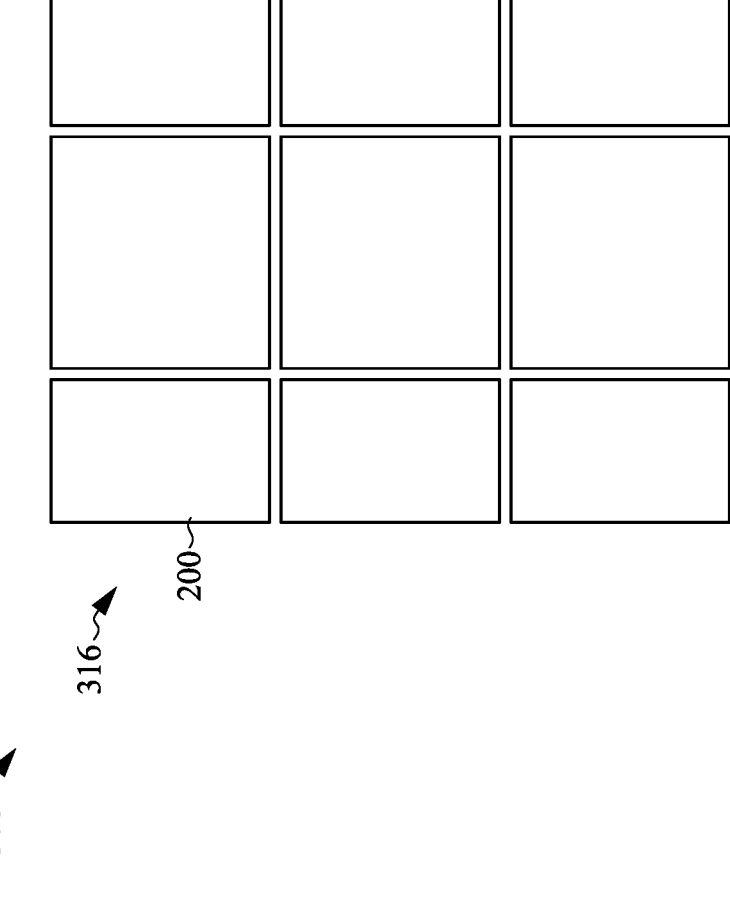
Figure 3C:
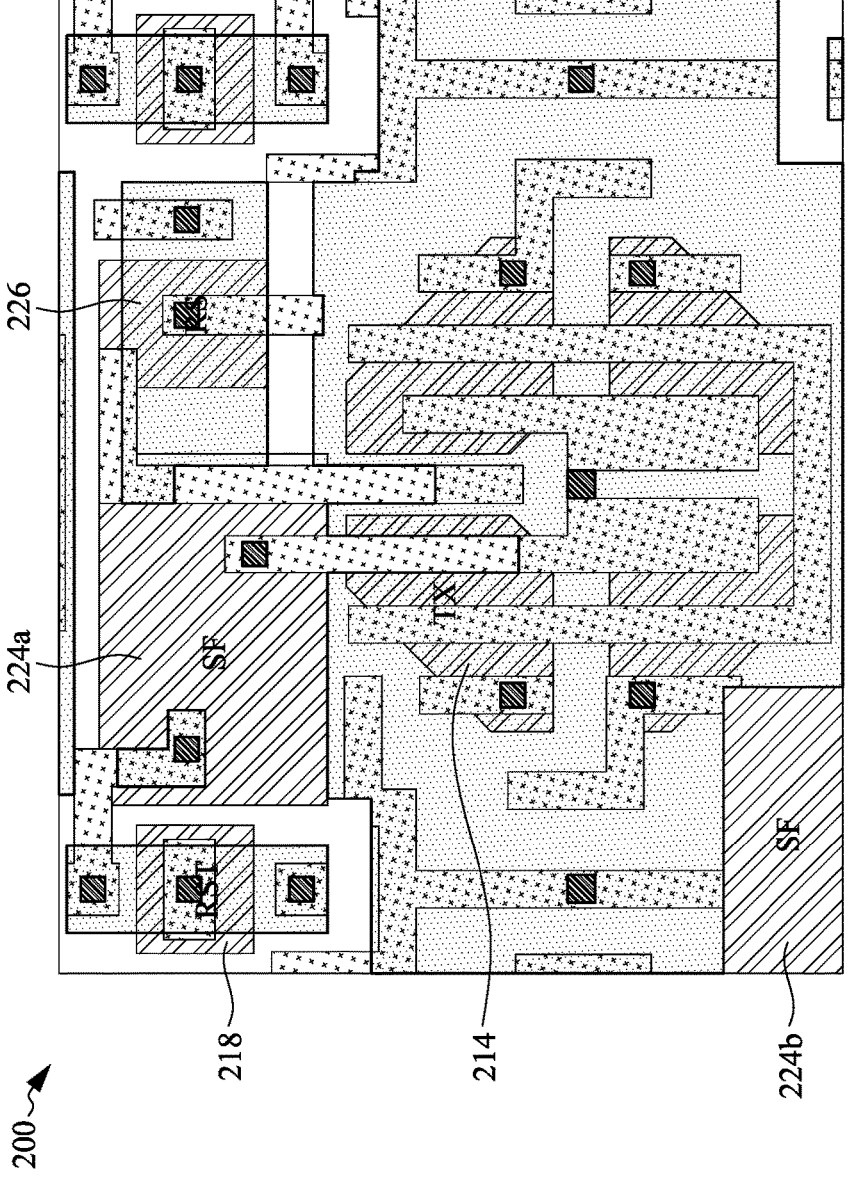

FIGS. 3A-3C are diagrams of examples 300 of a stacked image sensor device described herein. As shown in FIG. 3A, the stacked image sensor device may be formed by bonding a sensor wafer 302 and a circuitry wafer 304. For example, the bonding tool 116 may perform a bonding operation to bond the sensor wafer 302 and the circuitry wafer 304 using a hybrid bonding technique, a direct bonding technique, an eutectic bonding technique, and/or another bonding technique. In the bonding operation, sensor dies 306 on the sensor wafer 302 are bonded with associated circuitry dies 308 on the circuitry wafer 304 to form stacked image sensor devices 310. The image sensor devices 310 are then diced and packaged. Other processing steps may be performed to form the image sensor devices 310.

Each image sensor device 310 includes a sensor die 306 and a circuitry die 308. The sensor die 306 includes a pixel sensor array that includes a plurality of pixel sensors 200, or portions of a plurality of pixel sensors 200. In particular, the pixel sensor array includes at least the sensing regions 206 (and thus, the photodiodes 212) of the pixel sensors 200. Accordingly, the sensor die 306 primarily is configured to sense photons of incident light and convert the photons to a photocurrent 210.

The circuitry die 308 includes circuitry that is configured to measure, manipulate, and/or otherwise use the photocurrent 210. Moreover, the circuitry die 308 includes at least a subset of the transistors of the control circuitry regions 208 of the pixel sensors 200. For example, the circuitry die 308 may include the row select transistors 226 of the pixel sensors 200, the source follower transistors 224 of the pixel sensors 200, and/or a combination thereof. This provides increased area on the sensor die 306 for the photodiodes 212, which enables the size of the photodiodes 212 to be increased to increase the sensitivity and/or overall performance of the light sensing performance of the pixel sensor, and/or enables the size of the pixel sensors 200 to be decreased while maintaining the same size for the photodiodes 212.

As further shown in FIG. 3A, the sensor die 306 may include a back end of line (BEOL) region 312a and the circuitry die 308 may include a BEOL region 312b. The BEOL region 312a and the BEOL region 312b may each include one or more metallization layers that are insulated by one or more dielectric layers. The BEOL region 312a and the BEOL region 312b may electrically connect the sensor die 306 and the circuitry die 308, and may electrically connect one or more components of the sensor die 306 and the circuitry die 308 to packaging and/or other structures, among other examples. The sensor die 306 and the circuitry die 308 may be bonded at a bonding interface 314, which may be included between the BEOL region 312a and the BEOL region 312b or may be included in a portion of the BEOL region 312a and/or a portion of the BEOL region 312b.

FIG. 3B is a top-down view of an example pixel sensor array 316 included on a sensor die 306. The pixel sensor array 316 may be included on a sensor die 306 of an image sensor device 310. As shown in FIG. 3B, the pixel sensor array 316 may include a plurality of pixel sensors 200 (or portions of the plurality of pixel sensors 200). As further shown in FIG. 3B, the pixel sensors 200 may be arranged in a grid. In some implementations, the pixel sensors 200 are square-shaped (as shown in the example in FIG. 3B). In some implementations, the pixel sensors 200 include other shapes such as rectangle shapes, circle shapes, octagon shapes, diamond shapes, and/or other shapes.

In some implementations, the size (e.g., the width or the diameter) of the pixel sensors 200 is approximately 1 micron. In some implementations, the size (e.g., the width or the diameter) of the pixel sensors 200 is less than approximately 1 micron. For example, a width of one or more of the pixel sensors 200 may be included in a range of approximately 0.6 microns to approximately 0.7 microns. In these examples, the pixel sensors 200 may be referred to as sub-micron pixel sensors. Sub-micron pixel sensors may decrease the pixel sensor pitch (e.g., the distance between adjacent pixel sensors) in the pixel sensor array 316, which may enable increased pixel sensor density in the pixel sensor array 316 (which can increase the performance of the pixel sensor array 316). However, other values for the range of the size of the pixel sensors 200 are within the scope of the present disclosure.

FIG. 3C illustrates a detailed top-down view of a pixel sensor 200 included in the pixel sensor array 316. As shown in FIG. 3C, the pixel sensor 200 may include a transfer gate transistor 214, a reset gate transistor 218, and a row select transistor 226. Moreover, the pixel sensor 200 may include a plurality of source follower transistors 224, including a source follower transistor 224a and a source follower transistor 224b, among other examples. The source follower transistor 224b may be included in place of an STI region (e.g., the STI region may be omitted, and the source follower transistor 224b may be included instead). As described herein, a bonding pad region for the image sensor device 310 may include a dielectric plug that provides electrical and/or optical isolation instead of an STI region, which enables the source follower transistor 224b to be included in the location where an STI region might otherwise be included. In some implementations, a size (e.g., a gate length, gate width, a channel length, a channel width) of the source follower transistor 224a and/or the source follower transistor 224b may be increased because of an STI region being omitted. For example, a gate length of the source follower transistor 224a and/or the source follower transistor 224b may be included in a range of approximately 200 nanometers to approximately 5000 nanometers to achieve increased amplification and reduced signal noise relative to a gate length of source follower transistor in an image sensor device in which an STI region is included (which may be included in a range of approximately 100 nanometers to approximately 600 nanometers). However, other values for these ranges are within the scope of the present disclosure.

As indicated above, FIGS. 3A-3C are provided as examples. Other examples may differ from what is described with regard to FIGS. 3A-3C.

Figure 4:
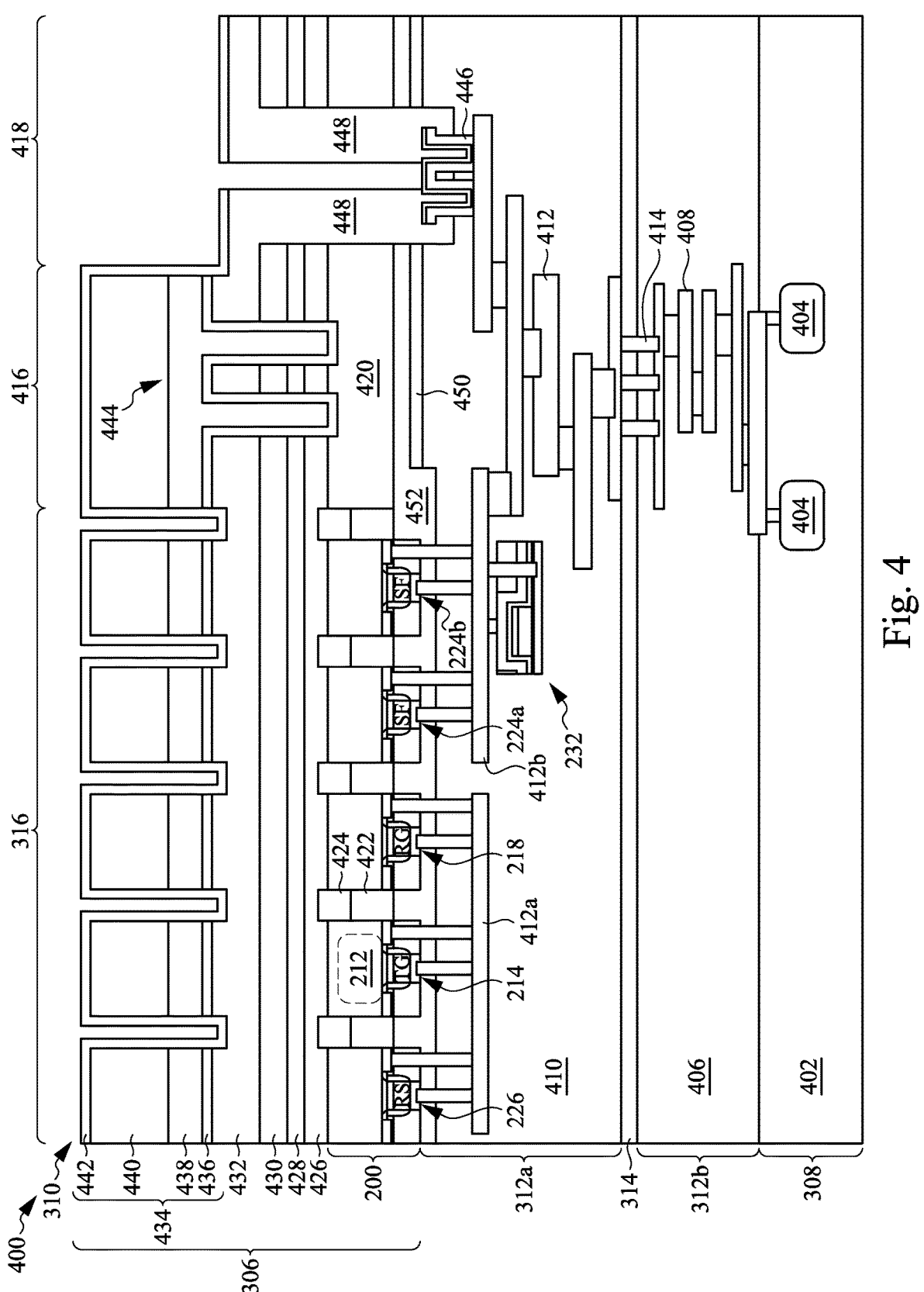
FIG. 4 is a diagram of an example implementation of an image sensor device described herein.

FIG. 4 is a diagram of an example implementation 400 of an image sensor device 310 described herein. FIG. 4 illustrates a cross-sectional view of the example implementation 400 of the image sensor device 310.

As shown in FIG. 4, the image sensor device 310 may include a sensor die 306 and a circuitry die 308. The sensor die 306 may include a BEOL region 312a, and the circuitry die 308 may include a BEOL region 312b. The sensor die 306 and the circuitry die 308 may be bonded at a bonding interface 314. In particular, the BEOL region 312a of the sensor die 306 and the BEOL region 312b of the circuitry die 308 may be bonded at the bonding interface 314.

The circuitry die 308 may include a device region 402 in which logic circuitry 404 is included. The device region 402 may include a substrate, such as a semiconductor die substrate, a semiconductor wafer, a stacked semiconductor wafer, or another type of substrate. In some implementations, the device region 402 is formed of silicon (Si) (e.g., a silicon substrate), a material including silicon, a III-V compound semiconductor material such as gallium arsenide (GaAs), a silicon on insulator (SOI), or another type of semiconductor material.

The logic circuitry 404 may include one or more application-specific integrated circuit (ASIC) devices, one or more system-on-chip (SOC) devices, one or more transistors, and/or one or more other components configured to measure the magnitude of a photocurrent 210 generated by the pixel sensors 200 to determine light intensity of incident light and/or to generate images and/or video (e.g., digital images, digital video).

The BEOL region 312*b* may include a dielectric region 406 and a plurality of metallization layers 408. The dielectric region 406 may include one or more interlayer dielectric (ILD) layers, one or more intermetal dielectric (IMD) layers, and/or one or more etch stop layers (ESLs), among other examples. The dielectric region 406 may include one or more dielectric materials, such as a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silicate glass (FSG), and/or carbon doped silicon oxide, among other examples.

The metallization layers 408 may include bonding pads, conductive lines, trenches, vias, interconnects, and/or other types of conductive structures that electrically connect the logic circuitry 404 to one or more other regions of the circuitry die 308 and/or to one or more regions of the sensor die 306, among other examples. The metallization layers 408 may include one or more electrically conductive materials, such as, an electrically conductive metal, an electrically conductive metal alloy, an electrically conductive ceramic, tungsten (W), cobalt (Co), ruthenium (Ru), titanium (Ti), aluminum (Al), copper (Cu), and/or gold (Au), among other examples of electrically conductive materials.

The BEOL region 312*a* may include a dielectric region 410 and a plurality of metallization layers 412. The dielectric region 410 may include one or more ILD layers, one or more IMD layers, and/or one or more ESLs, among other examples. The dielectric region 410 may include one or more dielectric materials, such as a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silicate glass (FSG), and/or carbon doped silicon oxide, among other examples.

The metallization layers 412 may include bonding pads, conductive lines, trenches, vias, interconnects, and/or other types of conductive structures that electrically connect semiconductor devices of the sensor die 306 to one or more other regions of the sensor die 306 and/or to one or more regions of the circuitry die 308, among other examples. The metallization layers 412 may include one or more electrically conductive materials, such as, an electrically conductive metal, an electrically conductive metal alloy, an electrically conductive ceramic, tungsten (W), cobalt (Co), ruthenium (Ru), titanium (Ti), aluminum (Al), copper (Cu), and/or gold (Au), among other examples of electrically conductive materials.

The sensor die 306 and the circuitry die 308 may be bonded at the bonding interface 314 by dielectric to dielectric bonding (e.g., where the dielectric regions 406 and 410 are bonded), by metal to metal bonding (e.g., where the metallization layers 408 and 412 are bonded), and/or by another bonding configuration. In some implementations, bonding contacts 414 may be included in the BEOL regions 312*a* and 312*b* and may be used to bond the sensor die 306 and the circuitry die 308 at the bonding interface 314. The bonding contacts 414 may include one or more electrically conductive materials, such as, an electrically conductive metal, an electrically conductive metal alloy, an electrically conductive ceramic, tungsten (W), cobalt (Co), ruthenium (Ru), titanium (Ti), aluminum (Al), copper (Cu), and/or gold (Au), among other examples of electrically conductive materials. Signals may be routed and/or transferred between the sensor die 306 and the circuitry die 308 through the bonding contacts 414.

As further shown in FIG. 4, the image sensor device 310 (particularly the sensor die 306) may include a plurality of lateral regions, including a pixel sensor array 316, a black level correction (BLC) region 416 adjacent to (e.g., horizontally adjacent to) the pixel sensor array 316, and a bonding pad region 418 adjacent to (e.g., horizontally adjacent to) the BLC region 416, among other examples. The pixel sensor array 316 may include one or more pixel sensors 200. A pixel sensor 200 may include a photodiode 212 in a device region 420 of the sensor die 306. The device region 420 may include a substrate, such as a semiconductor die substrate, a semiconductor wafer, a stacked semiconductor wafer, or another type of substrate. In some implementations, the device region 420 is formed of silicon (Si) (e.g., a silicon substrate), a material including silicon, a III-V compound semiconductor material such as gallium arsenide (GaAs), a silicon on insulator (SOI), or another type of semiconductor material.

The photodiode 212 may include one or more doped regions of device region 420. The device region 420 may be doped with a plurality of types of ions to form a p-n junction or a PIN junction (e.g., a junction between a p-type portion, an intrinsic (or undoped) type portion, and an n-type portion) corresponding to the photodiode 212. For example, the device region 420 may be doped with an n-type dopant to form a first portion (e.g., an n-type portion) of the photodiode 212 and a p-type dopant to form a second portion (e.g., a p-type portion) of the photodiode 212. The photodiode 212 may be configured to absorb photons of incident light. The absorption of photons causes the photodiode 212 to accumulate a charge (referred to as a photocurrent 210) due to the photoelectric effect. Here, photons bombard the photodiode 212, which causes emission of electrons of the photodiode 212. The emission of electrons causes the formation of electron-hole pairs, where the electrons migrate toward the cathode of the photodiode 212 and the holes migrate toward the anode, which produces the photocurrent 210.

The photodiode 212 may be electrically and/or optically isolated from other photodiodes and/or other regions of the device region 420 by a p-type implant region 422 and a deep trench isolation (DTI) structure 424 over the p-type implant region 422. The p-type implant region 422 and the DTI structure 424 may form a grid around the photodiodes 212 of the pixel sensors 200 included in the pixel sensor array 316. The p-type implant region 422 may include a portion of the device region 420 that is doped with p-type ions. The p-type ions may include a p-type material (e.g., boron (B) or germanium (Ge), among other examples). The DTI structure 424 may include a dielectric structure (e.g., an oxide structure, a nitride structure) that extends from a top surface of the device region 420 to the p-type implant region 422.

The p-type implant region 422 may be included to reduce the depth of etching in the device region 420 for forming the DTI structure 424. Etching of the device region 420 may damage the device region 420 and the photodiodes 212 in the device region 420. The likelihood and/or amount of damage to the photodiodes 212 may increase as a function of etch time duration for etching the recesses in which the DTI structure 424 is formed. The deeper the DTI structure 424, the greater the etch time duration. Including the p-type implant region 422 enables the DTI structure 424 to be formed in the device region 420 to a reduced depth while still providing electrical and/or optical isolation along the full depth of the device region 420. The reduced depth of the DTI structure 424 in the device region 420 may reduce the etch time duration for forming the recesses of the DTI structure 424, which may reduce the likelihood and/or amount of damage caused to the photodiodes 212 during formation of the DTI structure 424

As further shown in FIG. 4, a plurality of transistors of the pixel sensor 200 may be located under the device region 420. For example, a transfer gate transistor 214 may be located under the photodiode 212 of the pixel sensor 200. The photodiode 212 may correspond to (or may be electrically connected with) a source/drain region of the transfer gate transistor 214. A photocurrent 210 generated by the photodiode 212 may be transferred to another source/drain region of the transfer gate transistor 214 when the transfer gate transistor 214 is activated. As another example, a reset gate transistor 218 may be located under the device region 420. As another example, a plurality of source follower transistors 224a and 224b may be located under the device region 420. As another example, a row select transistor 226 may be located under the device region 420.

The transistors 214, 218, 224a, 224b, and 226 may be electrically connected to one or more metallization layers 412 in the BEOL region 312a by one or more electrical contact. For example, each of the transistors 214, 218, 224a, 224b, and 226 may be electrically connected with a metallization layer 412 by a set of respective source/drain contacts and a respective gate contact. In some implementations, the transfer gate transistor 214, the reset gate transistor 218, and the row select transistor 226 may be electrically connected to a same metallization layer 412a. In some implementations, the source follower transistors 224a and 224b may be electrically connected to a same metallization layer 412b.

As further shown in FIG. 4, a capacitor 232 may be included in the BEOL region 312a and may be electrically connected with a metallization layer 412 in the BEOL region 312a. In some implementations, the capacitor 232 is located vertically under one or more of the source follower transistors 224a and/or 224b. In some implementations, the capacitor 232 is electrically connected with the same metallization layer 412b as the source follower transistors 224a and 224b. The transfer gate transistor 214, the reset gate transistor 218, the source follower transistors 224a and 224b, the row select transistor 226 and the capacitor 232 may be included in the same control circuitry region 208 in the sensor die 306.

As further shown in FIG. 4, one or more layers may be included over and/or on the device region 420. The one or more layers may include one or more dielectric layers, one or more antireflective coating (ARC) layers, one or more buffer layers, and/or one or more passivation layers, among other examples. As an example, an oxide layer 426 may be included over and/or on the device region 420. In some implementations, a thickness of the oxide layer 426 may be included in a range of approximately 30 angstroms to approximately 50 angstroms. However, other values for the range are within the scope of the present disclosure. As another example, an oxide layer 428 may be included over and/or on the oxide layer 426. In some implementations, a thickness of the oxide layer 428 may be included in a range of approximately 50 angstroms to approximately 70 angstroms. However, other values for the range are within the scope of the present disclosure.

As another example, an oxide layer 430 may be included over and/or on the oxide layer 428. In some implementations, a thickness of the oxide layer 430 may be included in a range of approximately 450 angstroms to approximately 500 angstroms. However, other values for the range are within the scope of the present disclosure. As another example, an oxide layer 432 may be included over and/or on the oxide layer 430. In some implementations, a thickness of the oxide layer 432 may be included in a range of approximately 500 angstroms to approximately 1000 angstroms. However, other values for the range are within the scope of the present disclosure.

The oxide layers 426-432 may include a hafnium oxide ($HfO_x$ such as $HfO_2$), an aluminum oxide ($Al_xO_y$ such as $Al_2O_3$), a tantalum oxide ($Ta_xO_y$ such as $Ta_2O_5$), a silicon oxide ($SiO_x$ such as $SiO_2$), and/or a zirconium oxide (ZrO), among other examples. Additionally and/or alternatively, one or more of the oxide layers 426-432 may include a nitride, such as a silicon carbonitride (SiCN) and/or a silicon nitride ($Si_xN_y$ such as $Si_3N_4$), among other examples.

As further shown in FIG. 4, a grid structure 434 may be included over the pixel sensors 200 in the pixel sensor array 316. The grid structure 434 may be configured to direct light toward the photodiodes 212 in the device region 420 to increase photon absorption in the pixel sensors 200, which may increase the quantum efficiency of the pixel sensors 200. The grid structure 434 may include a metal grid structure that includes one or more metal layers, a dielectric grid structure that includes one or more dielectric layers, or a composite grid structure that includes a combination of metal layers, dielectric layers, and/or ceramic layers, among other examples.

For example, the grid structure 434 may include a ceramic layer 436 over and/or on the oxide layer 432, a metal layer 438 over and/or on the ceramic layer 436, and/or an oxide layer 440 over and/or on the metal layer 438, among other examples. The ceramic layer 436 may include a titanium nitride (TiN) and/or another suitable material. In some implementations, a thickness of the ceramic layer 436 is included in a range of approximately 200 angstroms to approximately 400 angstroms. However, other values for the range are within the scope of the present disclosure. The metal layer 438 may include tungsten (W) and/or another suitable metal material. In some implementations, a thickness of the metal layer 438 is included in a range of approximately 1500 angstroms to approximately 1700 angstroms. However, other values for the range are within the scope of the present disclosure. The oxide layer 440 may include a hafnium oxide ($HfO_x$ such as $HfO_2$), an aluminum oxide ($Al_xO_y$ such as $Al_2O_3$), a tantalum oxide ($Ta_xO_y$ such as $Ta_2O_5$), a silicon oxide ($SiO_x$ such as $SiO_2$), and/or a zirconium oxide (ZrO), among other examples. In some implementations, a thickness of the oxide layer 440 is included in a range of approximately 3000 angstroms to approximately 5000 angstroms. However, other values for the range are within the scope of the present disclosure.

A buffer oxide layer 442 may be included over and/or on the grid structure 434. The buffer oxide layer 442 may include a hafnium oxide ($HfO_x$ such as $HfO_2$), an aluminum oxide ($Al_xO_y$ such as $Al_2O_3$), a tantalum oxide ($Ta_xO_y$ such as $Ta_2O_5$), a silicon oxide ($SiO_x$ such as $SiO_2$), and/or a zirconium oxide (ZrO), among other examples. In some implementations, a thickness of the buffer oxide layer 442 may be included in a range of approximately 200 angstroms to approximately 300 angstroms. However, other values for the range are within the scope of the present disclosure.

In some implementations, the pixel sensor array 316 includes one or more additional layers and/or structures. For example, a filter layer may be included above and/or on the buffer oxide layer 442 for one or more pixel sensors 200 in the pixel sensor array 316. The filter layer may include one or more visible light color filter regions configured to filter particular wavelengths or wavelength ranges of visible light (e.g., that permit particular wavelengths or wavelength ranges of visible light to pass through the filter layer), one or more near infrared (NIR) filter regions (e.g., NIR band-pass filter regions) configured to permit wavelengths associated with NIR light to pass through the filter layer and to block other wavelengths of light, one or more NIR cut filter regions configured to block NIR light from passing through the filter layer, and/or other types of filter regions. In some implementations, one or more pixel sensors 200 in the pixel sensor array 316 are each configured with a filter region of the filter layer. In some implementations, filter regions may be omitted from the filter layer for one or more pixel sensors 200 in the pixel sensor array 316 to permit all wavelengths of light to pass through the filter layer for the one or more pixel sensors 200. In these examples, the one or more pixel sensors 200 may be configured as white pixel sensors.

As another example, a micro-lens layer may be included above and/or on the filter layer. The micro-lens layer may include a plurality of micro-lenses. In particular, the micro-lens layer may include a respective micro-lens for each of the pixel sensors 200 included in the pixel sensor array 316.

The BLC region 416 may include a light-blocking structure 444 that prevents light from entering a sensing region in the device region 420 under the light-blocking structure 444. The sensing region is "dark" in that the light-blocking structure 444 prevents incident light from entering the sensing region. This enables the sensing region to generate a dark current measurement for black level correction (or black level calibration) for the pixel sensor array 316.

The light-blocking structure 444 may include one or more layers. The one or more layers may include a portion of the ceramic layer 436 and a portion of the metal layer 438. In some implementations, the light-blocking structure 444 includes one or more portions that extend through the layers 426-430 to reflect light away from the sensing region that might otherwise enter the device region 420 around the light-blocking structure 444.

The bonding pad region 418 may include a bonding pad 446 that is electrically connected with a metallization layer 412 in the BEOL region 312a of the sensor die 306. The bonding pad 446 may be included in a recess in the dielectric region 410 of the BEOL region 312a. In particular, the top surface of the bonding pad 446 may be located below the device region 420 of the sensor die 306 (e.g., below a bottom surface of the device region 420).

The bonding pad 446 may include a conductive material, such as gold, silver, aluminum, copper, aluminum-copper, titanium, tantalum, titanium nitride, tantalum nitride, tungsten, a metal alloy, other metals, or a combination thereof. The bonding pad 446 may provide electrical connections between the metallization layers 412 of the sensor die 306 and external devices and/or external packaging.

The bonding pad 446 may be at least partially surrounded by a dielectric plug 448, in the bonding pad region 418, that extends through the device region 420. The dielectric plug 448 may extend fully through the device region 420 (e.g., from a top surface of the device region 420 to a bottom surface of the device region 420) and into a portion of the dielectric region 410 of the BEOL region 312a. In this way, the dielectric plug 448 may fully isolate (e.g., electrically, thermally, and/or optically) the photodiodes 212 of the pixel sensors 200 in the device region 420 from sources of noise (e.g., electrical and/or optical noise) in the device region 420. The dielectric plug 448 may also extend through an etch stop layer 450 and/or a dielectric layer 452 included between the device region 420 and the dielectric region 410 of the BEOL region 312a, through the layers 426-430, and/or through another layer in the sensor die 306, among other examples. The dielectric plug 448 may include one or more dielectric materials, such as a silicon oxide ($SiO_x$), a silicon nitride ($Si_xN_y$), a silicon oxynitride (SiON), tetraethyl ortho-silicate oxide, phosphosilicate glass (PSG), borophospho-silicate glass (BPSG), fluorinated silicate glass (FSG), and/or carbon doped silicon oxide, among other examples.

The dielectric plug 448 fully extending through the device region 420 may provide electrical, thermal, and/or optical isolation in the device region 420 without the use of an additional STI region in the bonding pad region 418. The omission of an STI region may enable the plurality of source follower transistors 224a and 224b to be included in the pixel sensor 200, and/or may enable the size of the source follower transistor 224a and/or 224b to be increased. The increased size and/or increased quantity of the source follower transistors 224 in the sensor die 306 may improve the amplification of the photocurrent 210 by reducing noise in the photocurrent 210 as amplified and/or by increasing the amplitude of the photocurrent 210 as amplified, among other examples.

Accordingly, in the example implementation 400 of the image sensor device 310, the image sensor device 310 may include a sensor die 306 and a circuitry die 308 bonded with the sensor die 306 at bonding interface 314. The sensor die 306 includes a pixel sensor 200 that includes a sensing region 206 that includes a photodiode 212 in a device region 420 of the sensor die 306. The pixel sensor 200 may include a control circuitry region 208, below the device region 420, that includes a transfer gate transistor 214, a reset gate transistor 218 electrically connected with the transfer gate transistor 214, a plurality of source follower transistors 224a, 224b electrically connected with the transfer gate transistor 214 and the reset gate transistor 218, a capacitor 232 electrically connected with the plurality of source follower transistors 224a, 224b, and a row select transistor 226 electrically connected with the capacitor 232. The capacitor 232 may be configured to store a photocurrent 210 received from the plurality of source follower transistors 224a, 224b. The capacitor 232 may be included in a BEOL region 312a of the sensor die 306. The plurality of source follower transistors 224a, 224b, and the capacitor 232 may be electrically connected with the same metallization layer 412b in the BEOL region 312a of the sensor die 306.

As indicated above, FIG. 4 is provided as an example. Other examples may differ from what is described with regard to FIG. 4.

Figure 5:
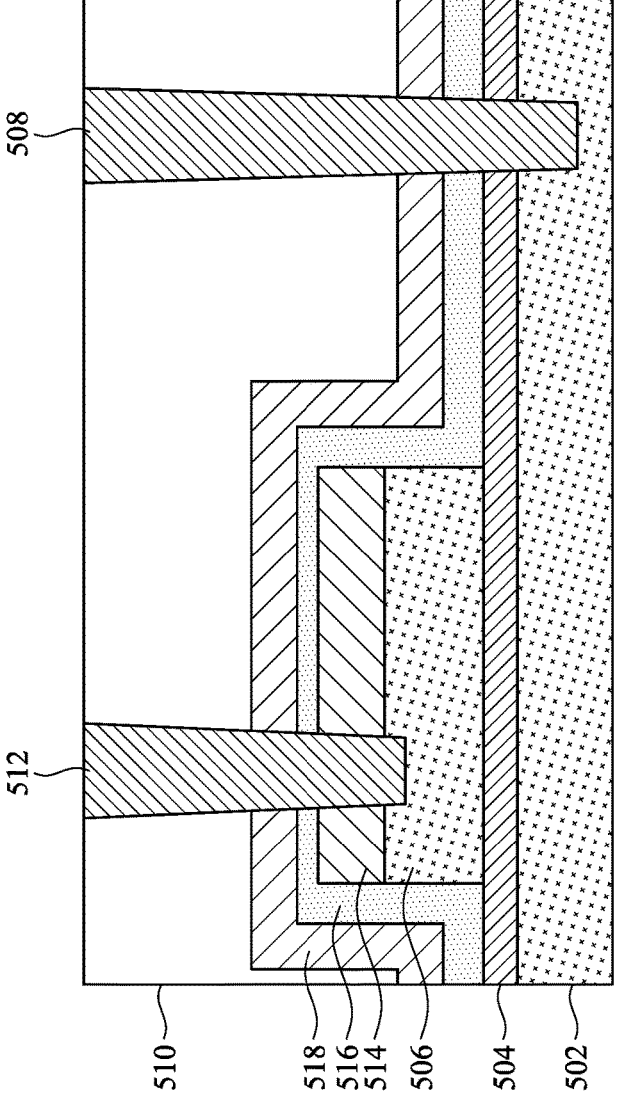
FIG. 5 is a diagram of an example implementation of a capacitor described herein.
Figure 5:

FIG. 5 is a diagram of an example implementation 500 of a capacitor 232 described herein. The example implementation 500 includes an example structural implementation of the capacitor 232 (e.g., an example capacitor structure that may be used to implement the capacitor 232).

As shown in FIG. 5, the capacitor 232 may include a first conductive layer 502, an insulator layer 504, and a second conductive layer 506. The first conductive layer 502 and the second conductive layer 506 may correspond to the conductive electrode layers of the capacitor 232. The first conductive layer 502 may be referred to as the capacitor bottom metal (CBM) layer of the capacitor 232, and the second conductive layer 506 may be referred to as the capacitor top metal (CTM) layer of the capacitor 232. The insulator layer 504 may be located between the first conductive layer 502 and the second conductive layer 506. The first conductive layer 502, the insulator layer 504, and the second conductive layer 506 may form a metal-insulator-metal (MIM) structure of the capacitor 232.

The first conductive layer 502 and the second conductive layer 506 may each include one or more electrically conductive materials, such as one or more metals, one or more metal alloys, and/or one or more of another type of electrically conductive materials. Examples include tungsten (W), cobalt (Co), ruthenium (Ru), titanium (Ti), aluminum (Al), copper (Cu) or gold (Au), titanium nitride (TiN), and/or tantalum nitride (TaN), among other examples. The insulator layer 504 may include one or more electrically insulating and/or dielectric materials. In some implementations, the insulator layer 504 includes one or more dielectric materials having a relatively high dielectric constant (high-k), such as a dielectric constant greater relative to the dielectric constant of silicon dioxide ($SiO_2$). Examples include zirconium oxide ($ZrO_x$ such as $ZrO_2$), aluminum oxide ($Al_xO_y$ such as $Al_2O_3$), silicon nitride ($Si_xN_y$ such as $Si_3N_4$), yttrium oxide ($Y_xO_y$ such as $Y_2O_3$), lanthanum oxide ($La_xO_y$ such as $La_2O_3$), yttrium titanium oxide ($Y_xTiO_y$ such as $Y_2TiO_5$), hafnium oxide ($HfO_x$ such as $HfO_2$), and/or tantalum oxide ($Ta_xO_y$ such as $Ta_2O_5$), among other examples.

As further shown in FIG. 5, the capacitor 232 may be electrically connected with contacts that electrically connect the capacitor 232 to other conductive structures in the image sensor device 310. A bottom metal contact 508 may be located in a dielectric layer 510, and a top metal contact 512 may be located in the dielectric layer 510. The bottom metal contact 508 may be electrically connected with the first conductive layer 502. The top metal contact 512 may be electrically connected with the second conductive layer 506. The second conductive layer 506 may have a width that is less than the width of the first conductive layer 502 such that the bottom metal contact 508 can land on the first conductive layer 502 without contacting (and electrically shorting to) the second conductive layer 506. The bottom metal contact 508 and the top metal contact 512 may each include tungsten (W), cobalt (Co), ruthenium (Ru), titanium (Ti), aluminum (Al), copper (Cu), and/or gold (Au), among other examples of conductive materials.

In some implementations, the dielectric layer 510 corresponds to the dielectric region 410 of the BEOL region 312a included in the sensor die 306. Accordingly, the bottom metal contact 508 and the top metal contact 512 may electrically connect the capacitor 232 to one or more metallization layers 412 in the BEOL region 312a. In some implementations, the dielectric layer 510 corresponds to the dielectric region 406 of the BEOL region 312b included in the sensor die 306. Accordingly, the capacitor 232 may be included in the circuitry die 308 (e.g., in the BEOL region 312b of the circuitry die 308), and the bottom metal contact 508 and the top metal contact 512 may electrically connect the capacitor 232 to one or more metallization layers 408 in the BEOL region 312b.

As further shown in FIG. 5, one or more capping layers, such as capping layer 514, a capping layer 516, and/or a capping layer 518, among other examples. The capping layers 514-518 may be included over and/or on the capacitor 232. The capping layers 514-518 may electrically isolate the capacitor 232 from other structures in the dielectric layer 510. Additionally and/or alternatively, the capping layers 514-518 may function as a hard mask layer and/or an etch stop layer during manufacturing of the capacitor 232.

As indicated above, FIG. 5 is provided as an example. Other examples may differ from what is described with regard to FIG. 5. For example, while the capacitor 232 is illustrated in FIG. 5 as being implemented as a planar capacitor, the capacitor 232 may alternatively be implemented at a deep trench capacitor (DTC) and/or another type of capacitor.

Figure 6A:
FIGS. 6A-6R are diagrams of an example implementation described herein.
Figure 6B:
Figure 6C:
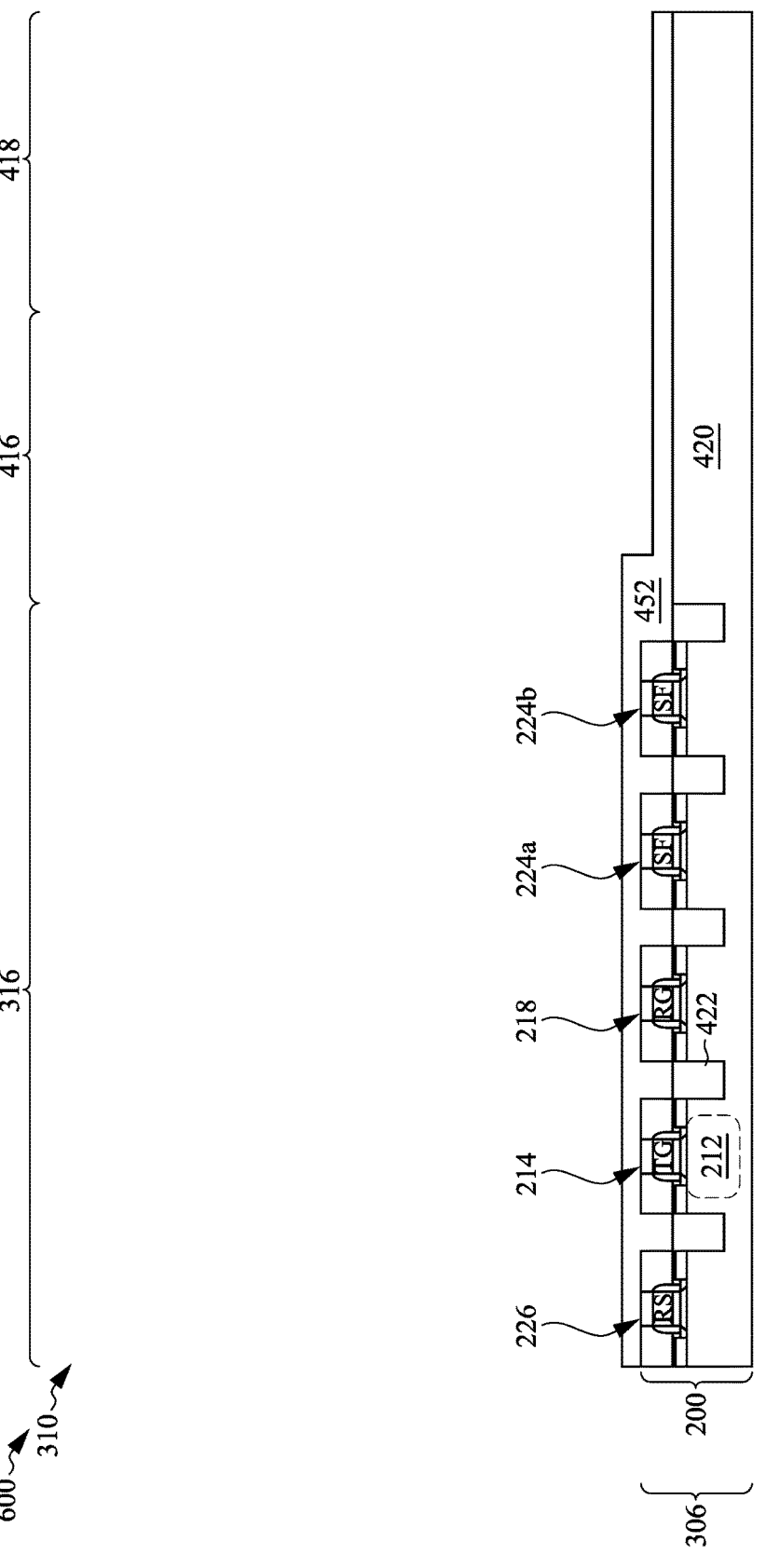
Figure 6D:
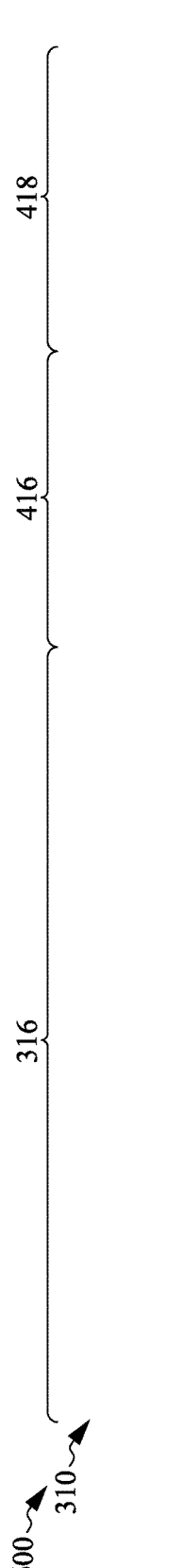
Figure 6D:
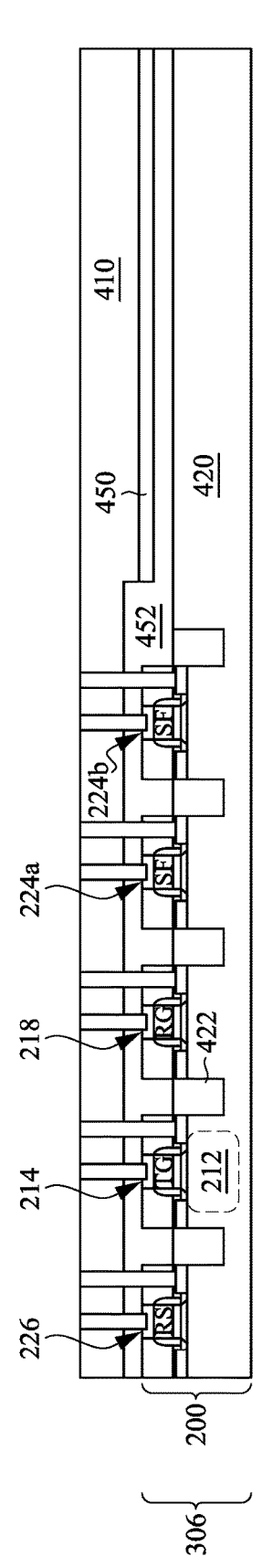
Figure 6E:
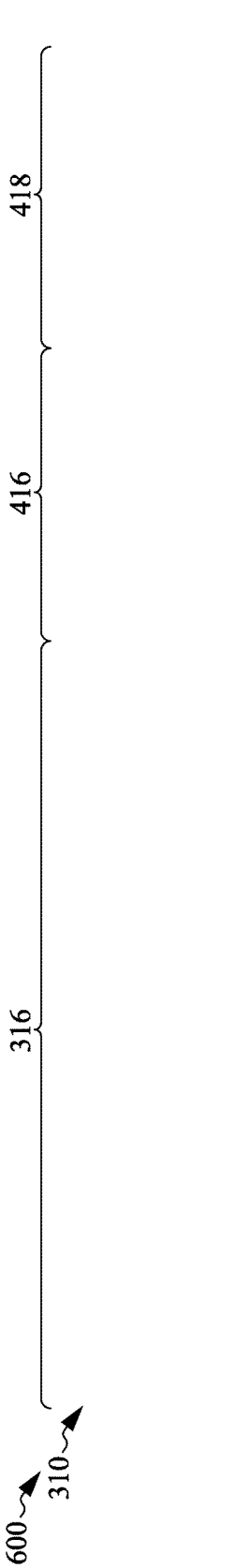
Figure 6E:
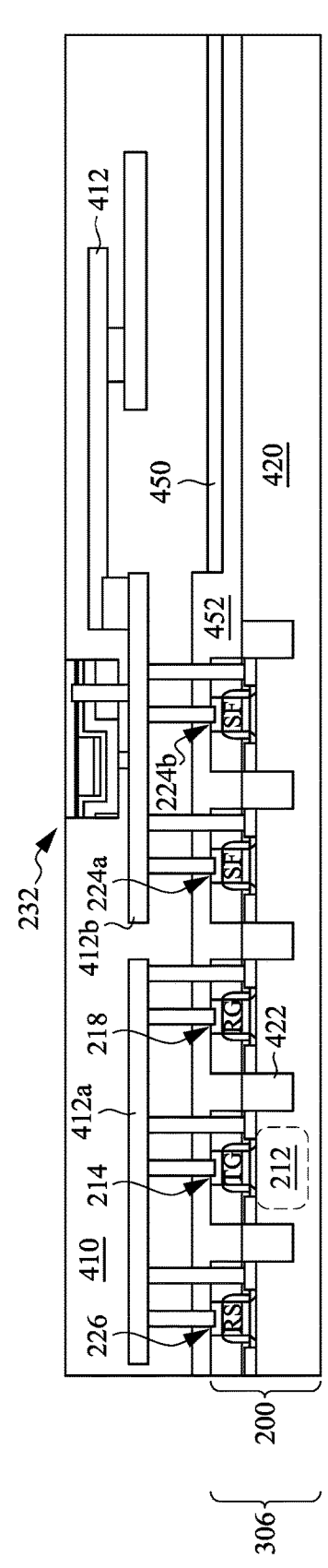
Figure 6F:
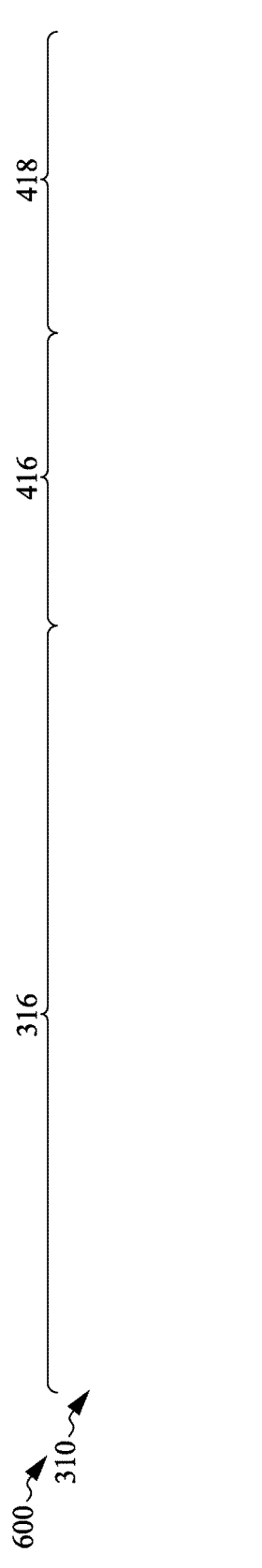
Figure 6F:
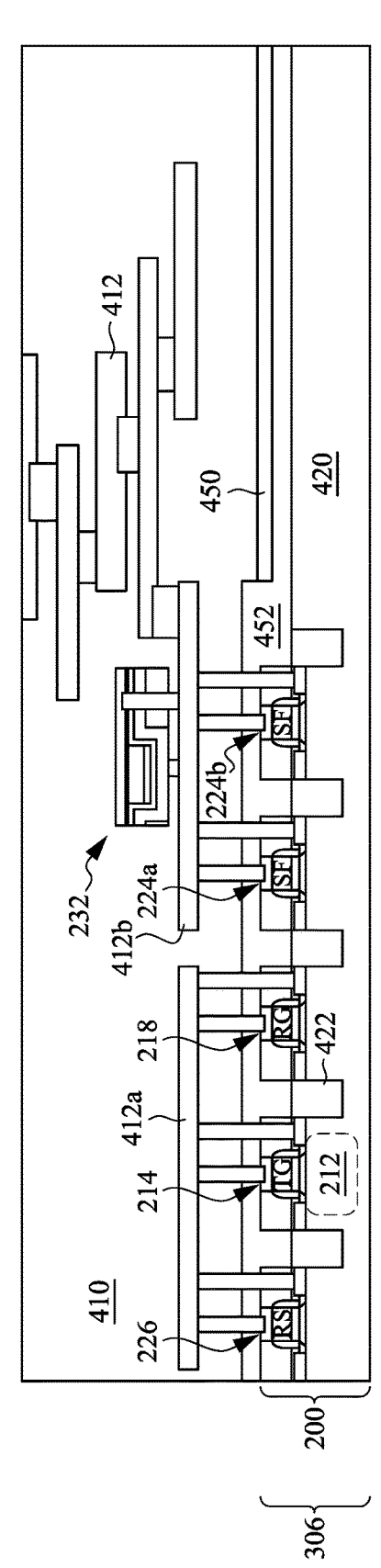
Figure 6G:
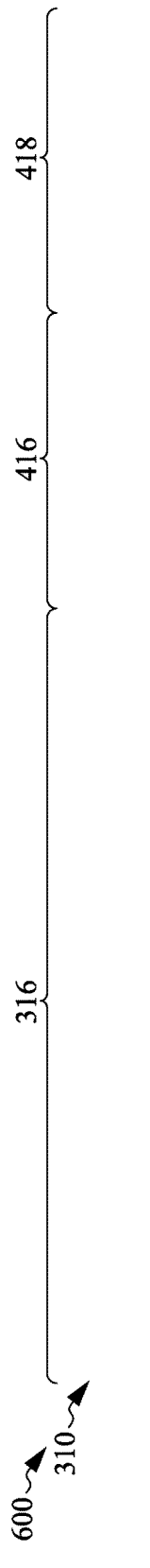
Figure 6H:
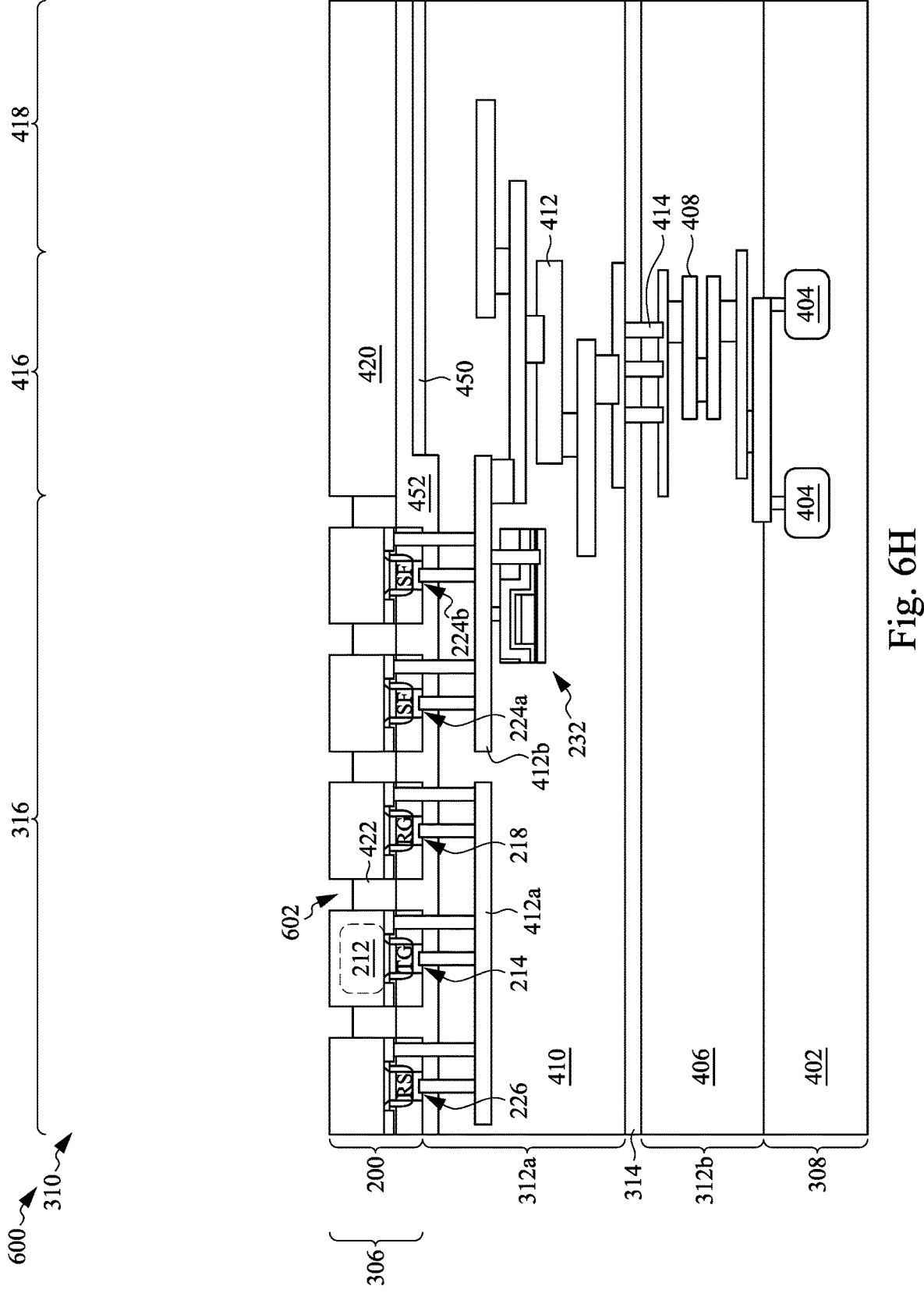
Figure 6I:
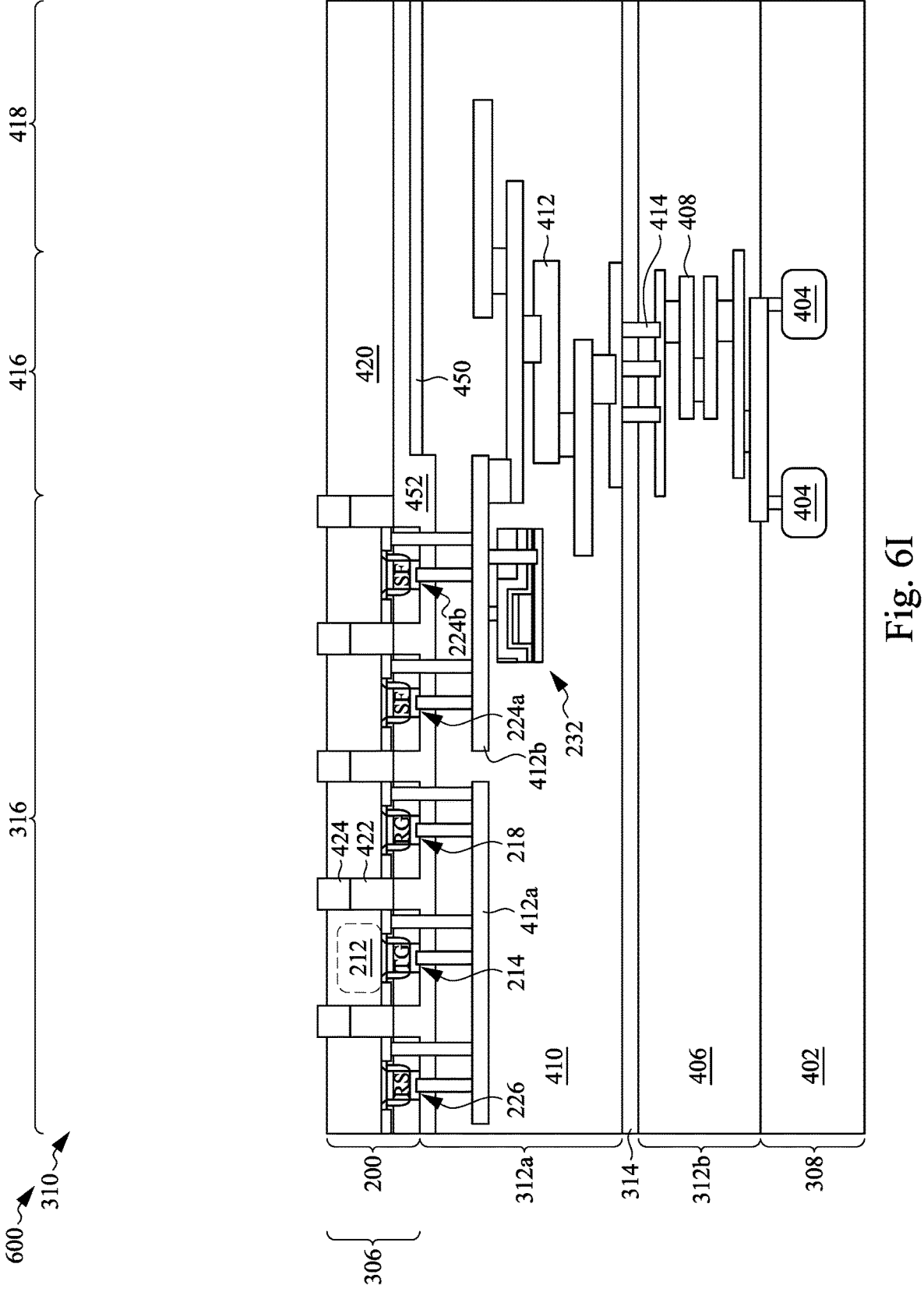
Figure 6J:
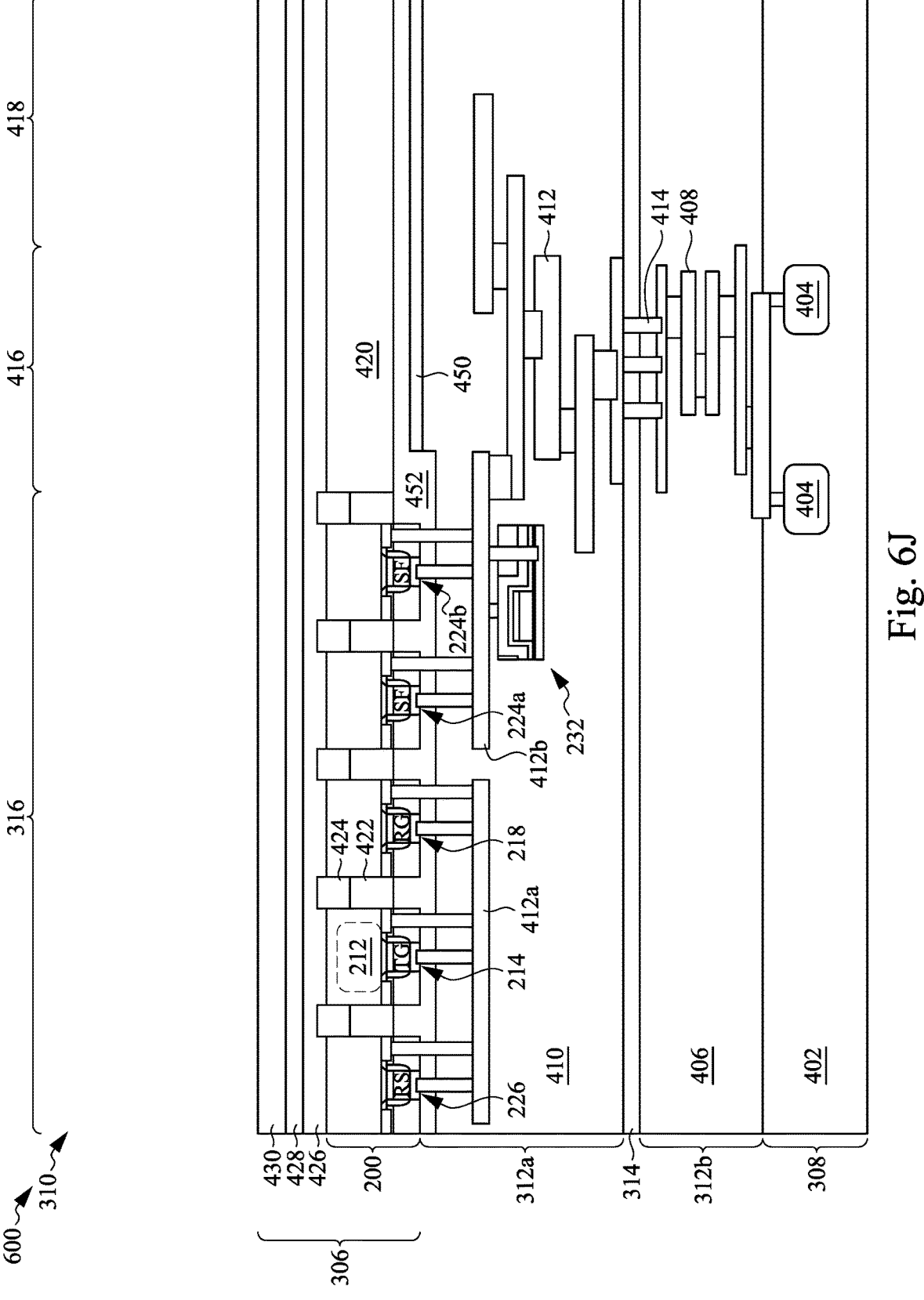
Figure 6K:
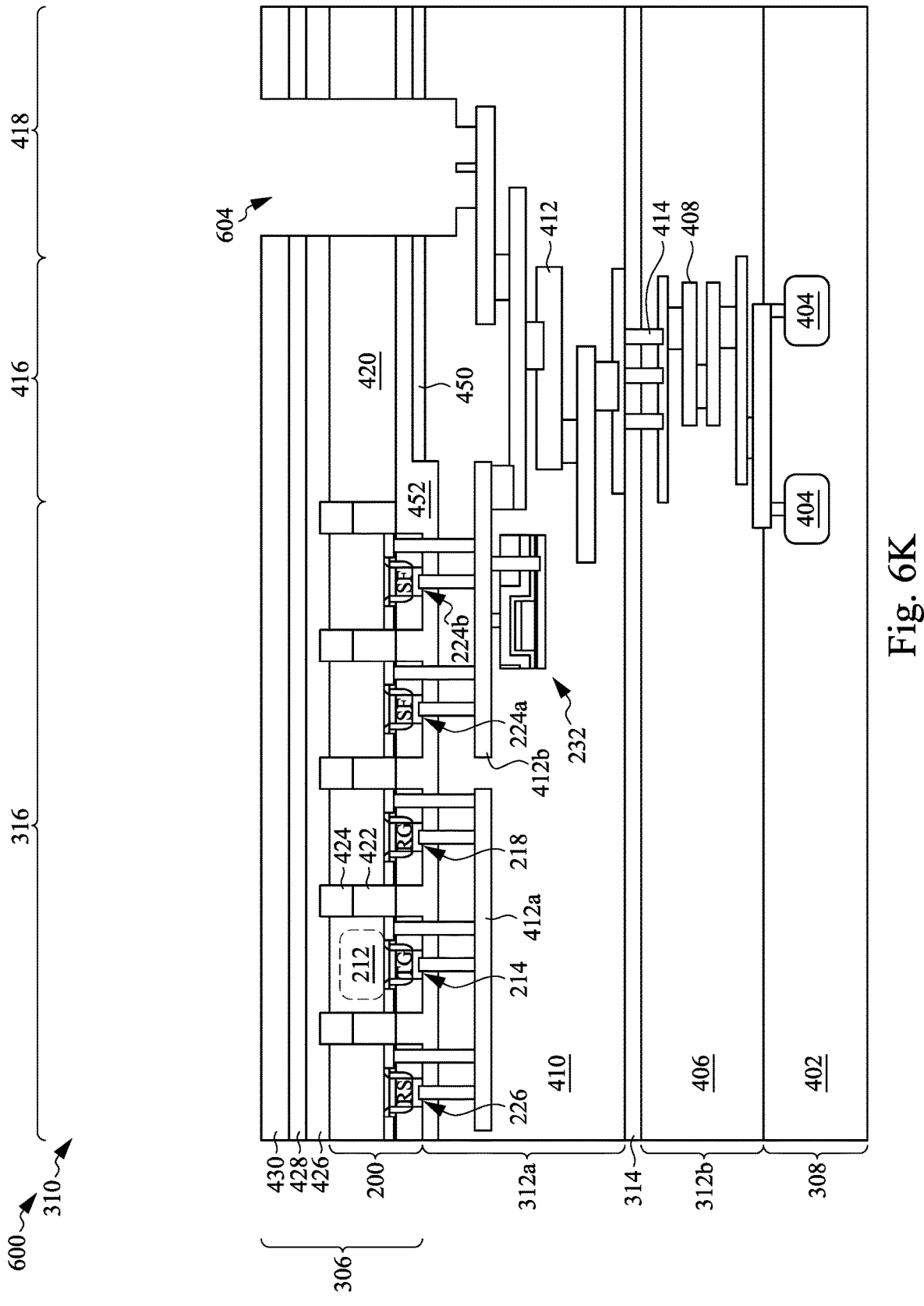
Figure 6L:
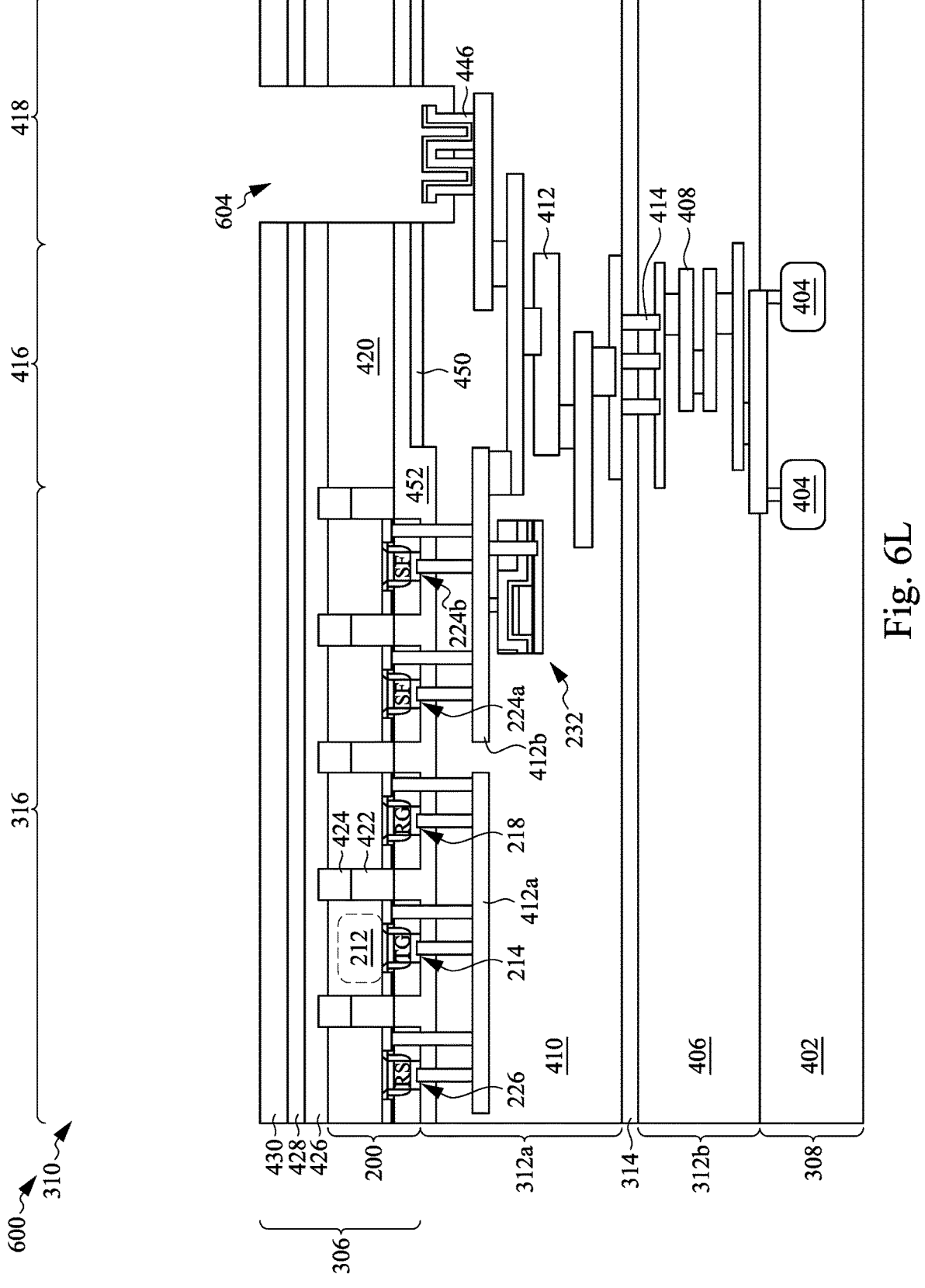
Figure 6M:
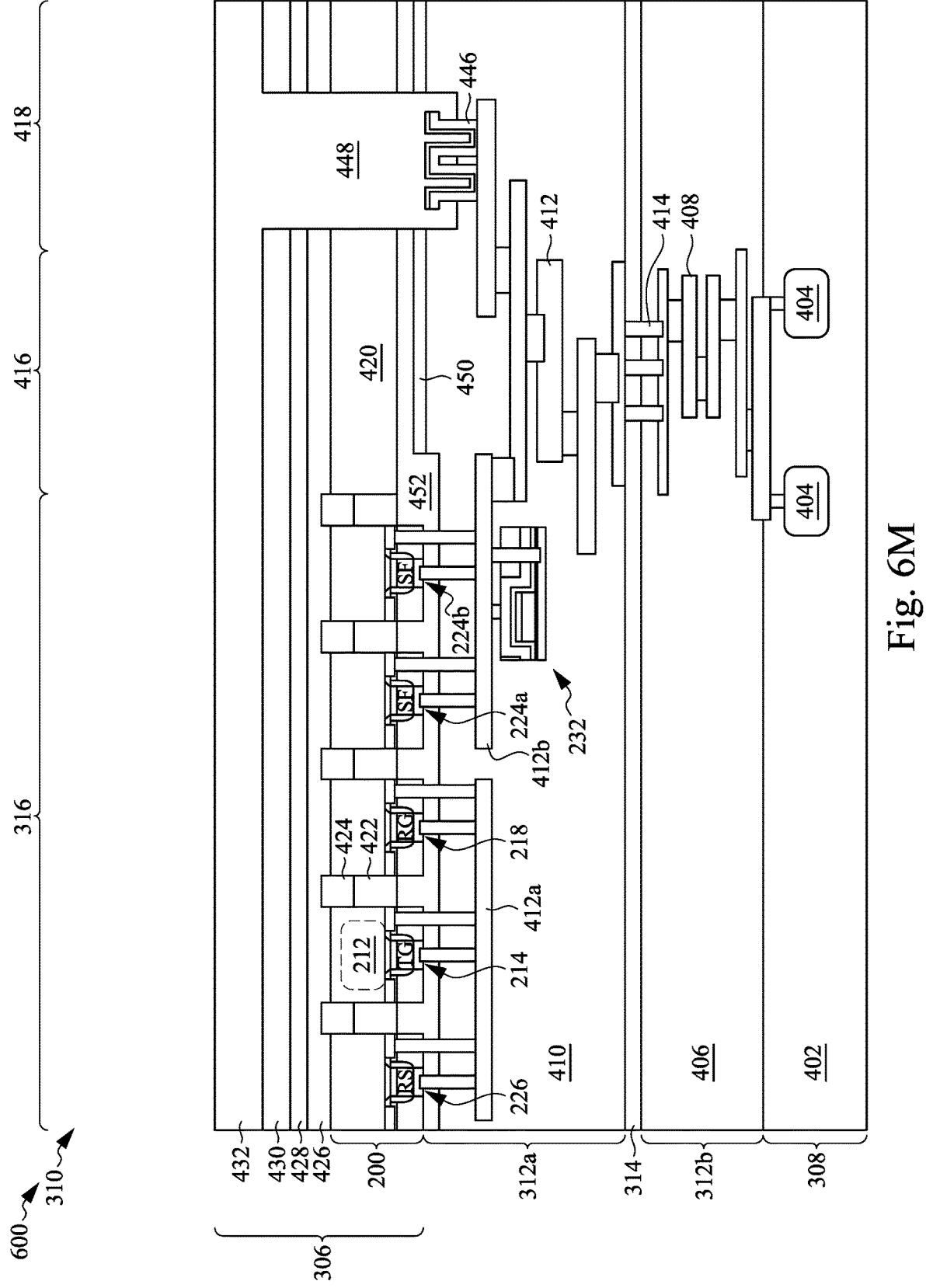
Figure 6N:
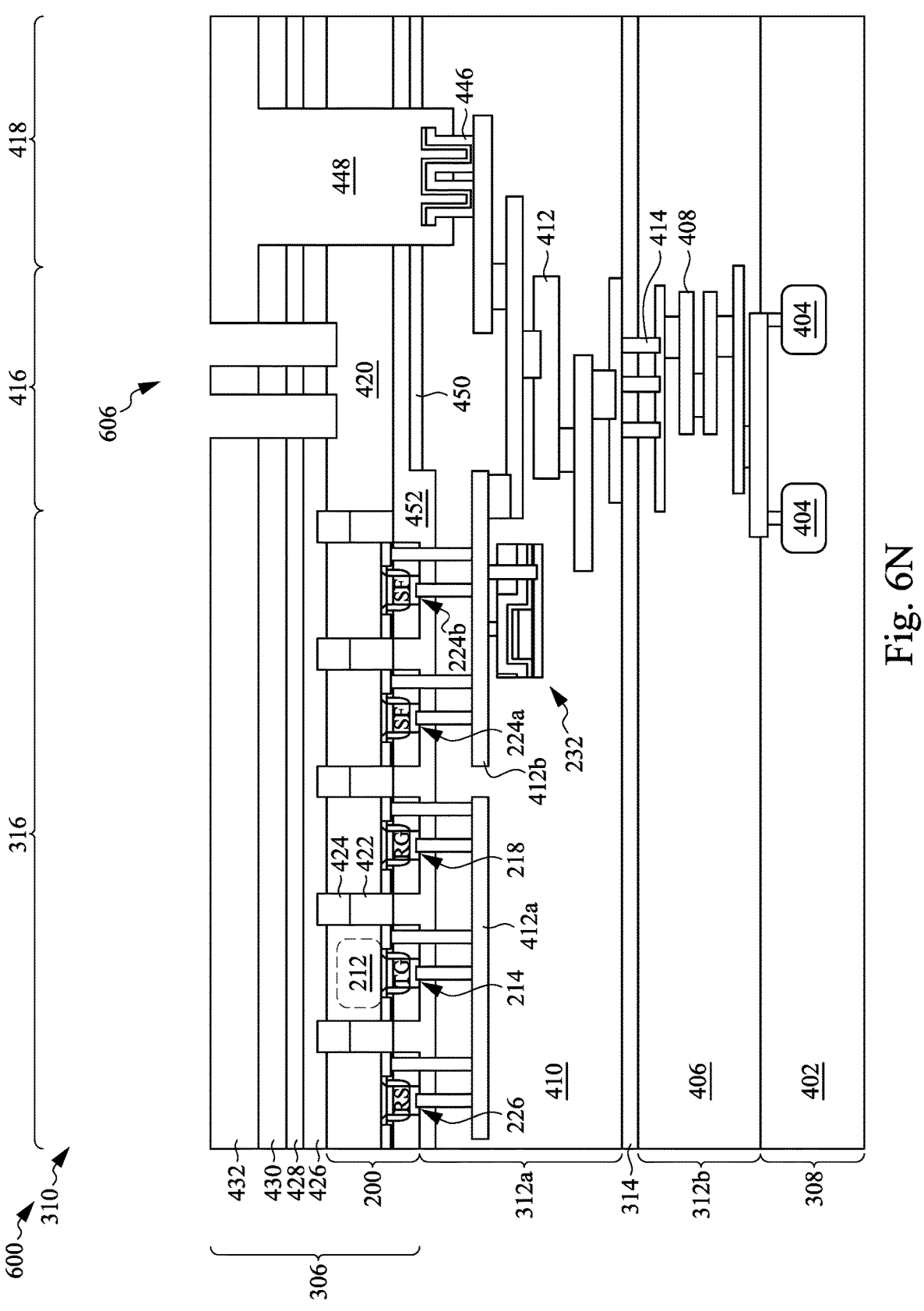
Figure 6O:
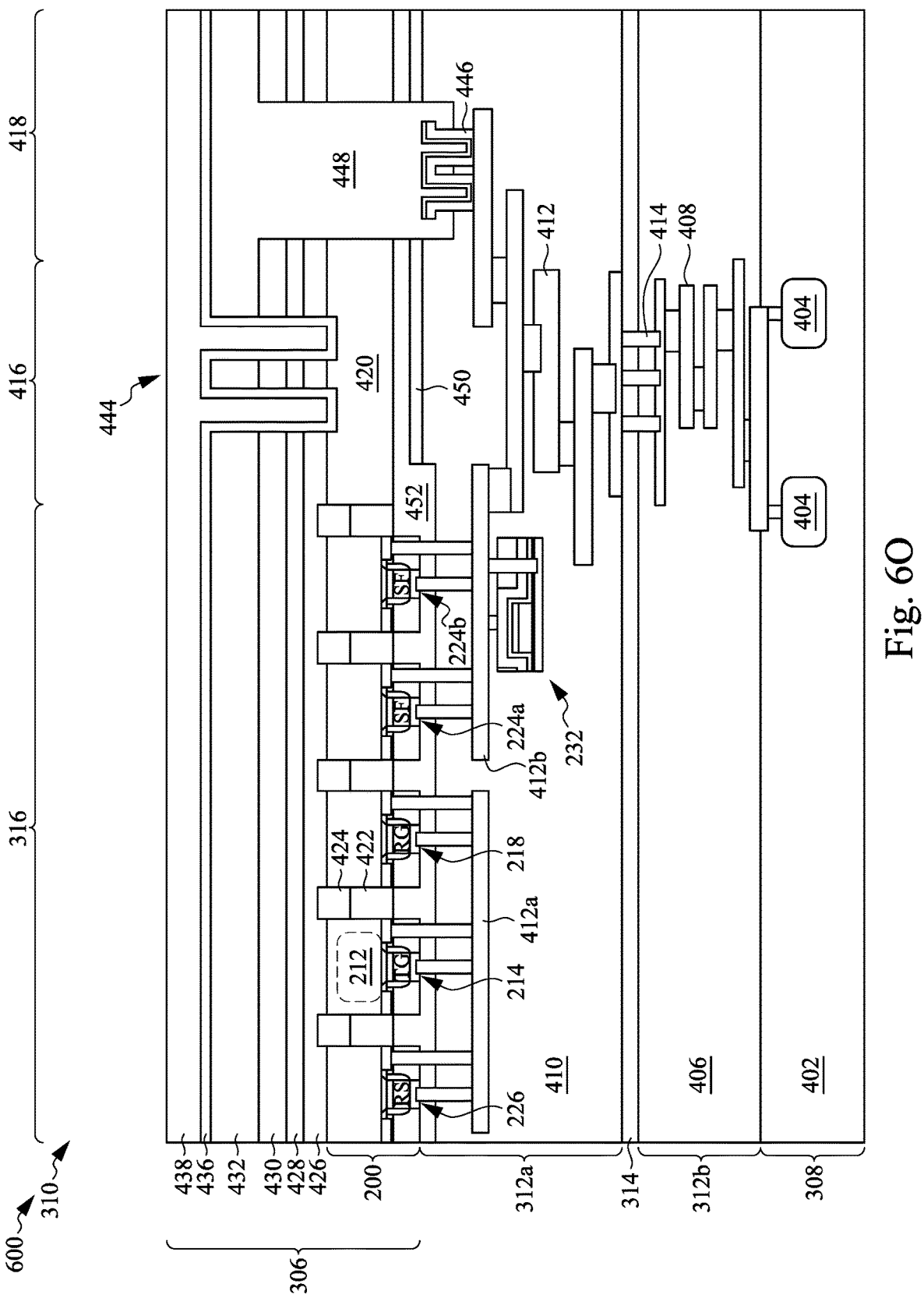
Figure 6P:
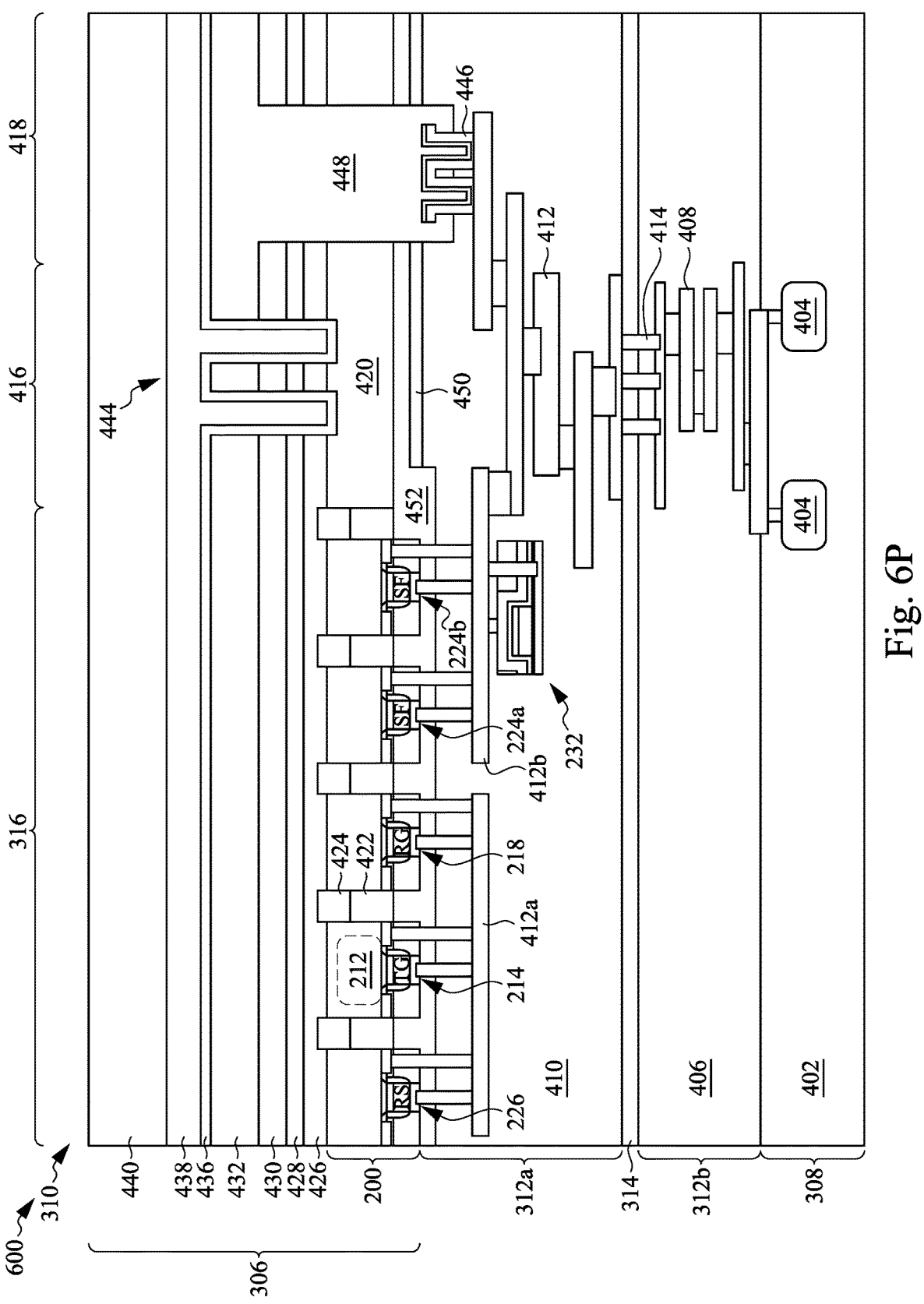
Figure 6Q:
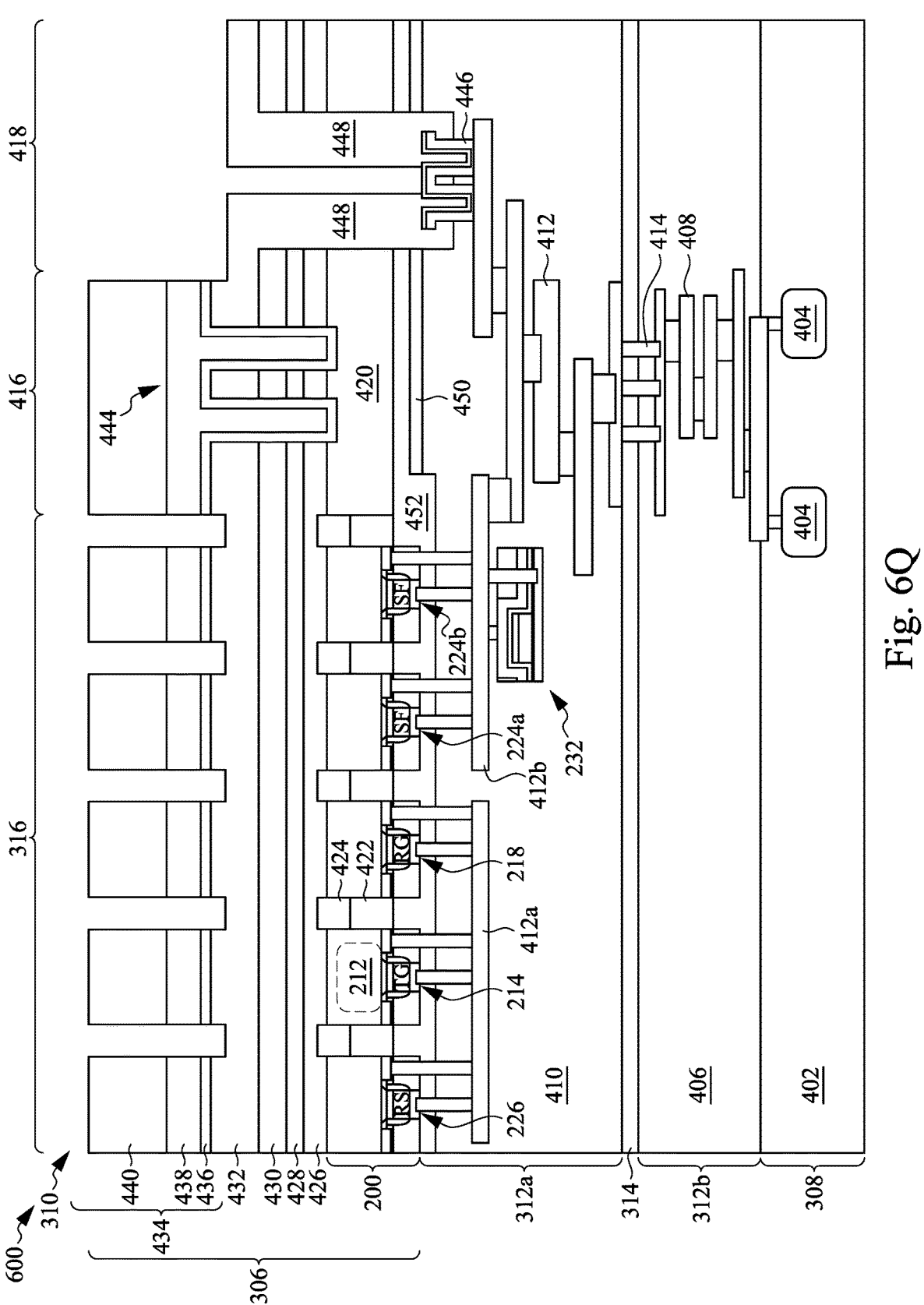
Figure 6R:
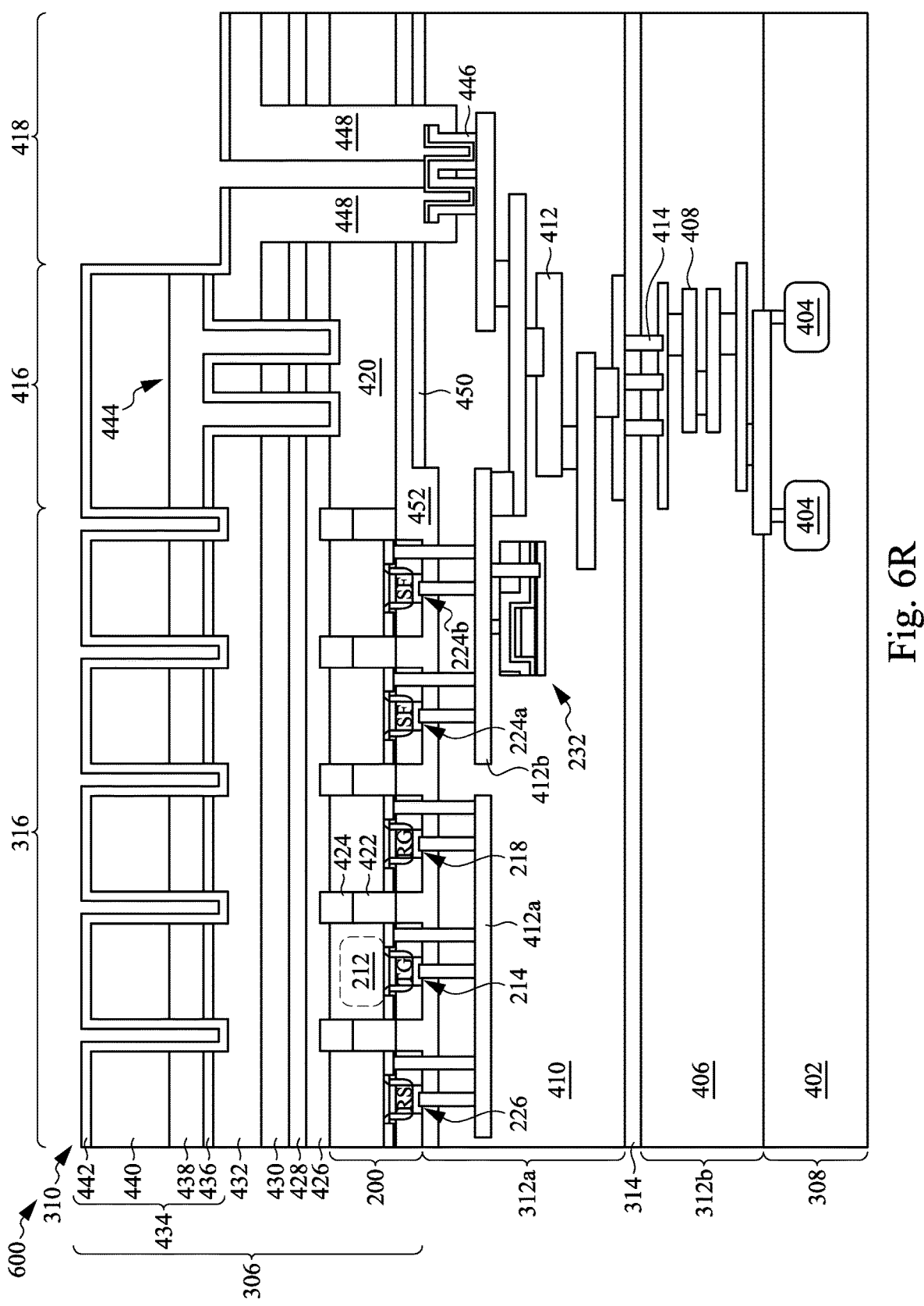

FIGS. 6A-6R are diagrams of an example implementation 600 described herein. Example implementation 600 may be an example process for forming the image sensor device 310 including the pixel sensor array 316 (which may include a plurality of pixel sensors 200), or a portion thereof. In some implementations, one or more of the semiconductor processing operations described in connection with FIGS. 6A-6R may be performed by one or more of the semiconductor processing tools 102-116. In some implementations, one or more of the semiconductor processing operations described in connection with FIGS. 6A-6R may be performed by another semiconductor processing tool.

Turning to FIG. 6A, the device region 420 may be provided. The device region 420 may be provided in the form of a semiconductor wafer, a semiconductor die, and/or another type of a semiconductor workpiece.

As shown in FIG. 6B, one or more regions of the device region 420 may be doped to form one or more photodiodes 212 of one or more pixel sensors 200 in the pixel sensor array 316 of the image sensor device 310. Moreover, one or more regions of the device region 420 may be doped to form p-type implant regions 422. The ion implantation tool 114 may perform one or more ion implantation operations to implant ions in the device region 420 to form the photodiode(s) 212 and to form the p-type implant regions 422.

As shown in FIG. 6C, a plurality of transistors may be formed over and/or on the device region 420. For example, one or more of the semiconductor processing tools 102-116 may form a transfer gate transistor 214 over a photodiode 212, may form a reset gate transistor 218, may form a plurality of source follower transistors 224a, 224b, and/or may form a row select transistor 226 for a pixel sensor 200.

In some implementations, forming a transistor may include the deposition tool 102 depositing a gate electrode of the transistor. The deposition tool 102 may perform one or more deposition operations to form the gate electrodes, which may include an ALD operation, a CVD operation, an epitaxial operation, a PVD operation, and/or another type of deposition operation. In some implementations, one or more of the semiconductor processing tools 102-116 use a self-aligned double patterning (SADP) technique and/or another type of multiple patterning technique to form a plurality of patterns that are used to deposit the gate electrodes. In some implementations, an EUV lithography technique is used to form the pattern that is used to form the gate electrodes.

In some implementations, forming a transistor may further include the ion implantation tool 114 doping one or more regions of the device region 420 to form one or more source/drain regions for the transistor. In some implementations, forming a transistor may include forming spacers on sidewalls of the gate electrode. The deposition tool 102 may perform one or more deposition operations to form the spacers, which may include an ALD operation, a CVD operation, an epitaxial operation, a PVD operation, and/or another type of deposition operation. In some implementations, the deposition tool 102 performs a deposition operation to deposit the material of the spacers, and the etch tool 108 removes portions of the material such that the remaining portions correspond to the spacers.

In some implementations, forming a transistor may further include forming a capping layer over and/or on the gate electrode. The deposition tool 102 may perform one or more deposition operations to form the capping layer, which may include an ALD operation, a CVD operation, an epitaxial operation, a PVD operation, and/or another type of deposition operation.

As further shown in FIG. 6C, a dielectric layer 452 may be formed over and/or on the device region 420, and over and/or on the transistors in the pixel sensor array 316. The dielectric layer 452 may be referred to as an ILD0 layer. The deposition tool 102 may deposit the dielectric layer 452 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the dielectric layer 452 after the deposition tool 102 deposits the dielectric layer 452.

As shown in FIGS. 6D-6F, the BEOL region 312a of the sensor die 306 may be formed. As shown in FIG. 6D, the deposition tool 102 may form the etch stop layer 450 and a first portion of the dielectric region 410. The deposition tool 102 may deposit the etch stop layer 450 and the first portion of the dielectric region 410 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the etch stop layer 450 and/or the first portion of the dielectric region 410 after the deposition tool 102 deposits the etch stop layer 450 and/or the first portion of the dielectric region 410.

As further shown in FIG. 6D, contacts (e.g., source/drain contacts, gate contacts) may be formed for the transistors of the pixel sensors 200 in the pixel sensor array 316. To form the contacts, a pattern in a photoresist layer is used to etch the first portion of the dielectric region 410 and/or the dielectric layer 452 to form recesses in which the contacts are to be formed. In these implementations, the deposition tool 102 forms the photoresist layer on the first portion of the dielectric region 410. The exposure tool 104 exposes the photoresist layer to a radiation source to pattern the photoresist layer. The developer tool 106 develops and removes portions of the photoresist layer to expose the pattern. The etch tool 108 etches the first portion of the dielectric region 410 and/or the dielectric layer 452 based on the pattern to form the recesses. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the recesses based on a pattern.

The deposition tool 102 and/or the plating tool 112 may deposit the contacts in the recesses. The deposition tool 102 and/or the plating tool 112 may deposit the contacts in a CVD operation, a PVD operation, an ALD operation, an electroplating operation, another deposition operation described above in connection with FIG. 1, and/or another suitable deposition operation. In some implementations, a seed layer is first deposited, and the contacts is deposited on the seed layer. In some implementations, the planarization tool 110 planarizes the contacts after the deposition tool 102 and/or the plating tool 112 deposits the contacts.

As shown in FIG. 6E, additional portions of the dielectric region 410 and metallization layers 412 may be formed in the BEOL region 312a. For example, the deposition tool 102 may deposit a second portion of the dielectric region 410 (e.g., using a CVD technique, an ALD technique, a PVD technique, and/or another type of deposition technique), the etch tool 108 may remove portions of the second portion to form recesses in the second portion, and the deposition tool 102 and/or the plating tool 112 may form a first metallization layer of the metallization layers 412 in the recesses (e.g., using a CVD technique, an ALD technique, a PVD technique, an electroplating technique, and/or another type of deposition technique), and so on. The transfer gate transistor 214, the reset gate transistor 218, and the row select transistor 226 may be electrically connected with a metallization layer 412a. The source follower transistors 224a and 224b may be electrically connected with a metallization layer 412b.

As further shown in FIG. 6E, one or more of the semiconductor processing tools 102-116 may form a capacitor 232 in the BEOL region 312a of the sensor die 306. For example, the etch tool 108 may form a recess in the dielectric region 410, the deposition tool 102 and/or the plating tool 112 may form the first conductive layer 502, the insulator layer 504, and the second conductive layer 506 of the capacitor 232. The deposition tool 102 and/or the plating tool 112 may additionally form the bottom metal contact 508, the top metal contact 512, and/or the capping layers 514-518.

As shown in FIG. 6F, the deposition tool 102, the etch tool 108, the plating tool 112, and/or another semiconductor processing tool may continue to perform similar processing operations to forming the BEOL region 312a until a sufficient or desired arrangement of metallization layers 412 is achieved.

As shown in FIG. 6G, the bonding tool 116 may perform a bonding operation to bond the sensor die 306 and the circuitry die 308 at the bonding interface 314. The bonding tool 116 may use a direct bonding technique, a eutectic bonding technique, a hybrid bonding technique, and/or another type of bonding technique to bond the sensor die 306 and the circuitry die 308. As shown in FIG. 6G, the sensor die 306 and the circuitry die 308 may be orientated such that the BEOL region 312a and the BEOL region 312b are facing. This enables the metallization layers 412 of the BEOL region 312a and the metallization layers 408 of the BEOL region 312b to be electrically connected by bonding contacts 414 to electrically connect the sensor die 306 and the circuitry die 308 to form the image sensor device 310.

As shown in FIG. 6H, backside processing of the sensor die 306 may be performed after the sensor die 306 and the circuitry die 308 are bonded. Recesses 602 may be formed in the bottom surface of the device region 420 over the p-type implant regions 422. The recesses 602 may partially extend into the device region 420 to the p-type implant regions 422.

In some implementations, a pattern in a photoresist layer is used to etch the device region 420 to form the recesses 602. In these implementations, the deposition tool 102 forms the photoresist layer on the device region 420. The exposure tool 104 exposes the photoresist layer to a radiation source to pattern the photoresist layer. The developer tool 106 develops and removes portions of the photoresist layer to expose the pattern. The etch tool 108 etches the device region 420 based on the pattern to form the recesses 602 in the device region 420. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the device region 420 based on a pattern.

As shown in FIG. 6I, the recesses 602 may be filled with a dielectric material to form the DTI structure 424. The deposition tool 102 may deposit the dielectric material in a CVD operation, a PVD operation, an ALD operation, another deposition operation described above in connection with FIG. 1, and/or another suitable deposition operation. In some implementations, the planarization tool 110 planarizes the DTI structure 424 after the deposition tool 102 deposits the dielectric material.

As shown in FIG. 6J, one or more dielectric layers may be formed over and/or on the backside of the device region 420 after formation of the DTI structure 424. For example, an oxide layer 426 may be formed over and/or on the device region 420. As another example, an oxide layer 428 may be formed over and/or on the oxide layer 426. As another example, an oxide layer 430 may be formed over and/or on the oxide layer 428. The deposition tool 102 may deposit the oxide layer 426, the oxide layer 428, and/or the oxide layer 430 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the oxide layer 426, the oxide layer 428, and/or the oxide layer 430 after the deposition tool 102 deposits the oxide layer 426, the oxide layer 428, and/or the oxide layer 430.

As shown in FIG. 6K, a recess 604 may be formed in the bonding pad region 418. The recess 604 may be formed through the oxide layers 426-430, through the device region 420, through the dielectric layer 452, through the etch stop layer 450, and into a portion of the dielectric region 410 in the BEOL region 312a. Forming the recess 604 fully through the device region 420 enables a dielectric plug to be fully formed through the device region 420 for electrical and/or optical isolation of the pixel sensors 200 in the device region 420. One or more metallization layers 412 in the BEOL region 312a may be exposed through the recess, which enables a bonding pad to be landed on the one or more metallization layers 412.

In some implementations, a pattern in a photoresist layer is used to etch the oxide layers 426-430, through the device region 420, through the dielectric layer 452, through the etch stop layer 450, and/or the dielectric region 410 to form the recess 604. In these implementations, the deposition tool 102 forms the photoresist layer on the oxide layer 430. The exposure tool 104 exposes the photoresist layer to a radiation source to pattern the photoresist layer. The developer tool 106 develops and removes portions of the photoresist layer to expose the pattern. The etch tool 108 etches the oxide layers 426-430, through the device region 420, through the dielectric layer 452, through the etch stop layer 450, and/or the dielectric region 410 based on the pattern to form the recess 604. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique).

In some implementations, a hard mask layer is used as an alternative technique for forming the recess 604 based on a pattern.

As shown in FIG. 6L, a bonding pad 446 may be formed in the recess 604 in the bonding pad region 418. The bonding pad 446 may be formed such that the top surface of the bonding pad 446 is below the device region 420. The deposition tool 102 and/or the plating tool 112 may deposit the bonding pad 446 in a CVD operation, a PVD operation, an ALD operation, an electroplating operation, another deposition operation described above in connection with FIG. 1, and/or another suitable deposition operation. In some implementations, a seed layer is first deposited, and the bonding pad 446 is deposited on the seed layer. In some implementations, the planarization tool 110 planarizes the bonding pad 446 after the deposition tool 102 and/or the plating tool 112 deposits the bonding pad 446.

As shown in FIG. 6M, an oxide material is deposited to form an oxide layer 432 over and/or on the oxide layer 430. Moreover, the oxide material fills in the recess 604 to form a dielectric plug 448 in the recess 604. The dielectric plug 448 at least partially surrounds the bonding pad 446 and provides electrical and/or optical isolation for the pixel sensors 200 in the device region 420. The deposition tool 102 may deposit the oxide material of the oxide layer 432 and of the dielectric plug 448 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the oxide layer 432 and/or the dielectric plug 448 after the deposition tool 102 deposits the oxide layer 432 and/or the dielectric plug 448.

As shown in FIG. 6N, recesses 606 may be formed in the BLC region 416. The recesses 606 may be formed through the oxide layers 426-432 and to the device region 420. In some implementations, a pattern in a photoresist layer is used to etch the oxide layers 426-432 to form the recesses 606. In these implementations, the deposition tool 102 forms the photoresist layer on the oxide layer 432. The exposure tool 104 exposes the photoresist layer to a radiation source to pattern the photoresist layer. The developer tool 106 develops and removes portions of the photoresist layer to expose the pattern. The etch tool 108 etches the oxide layers 426-432 based on the pattern to form the recesses 606. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the oxide layers 426-432 based on a pattern.

As shown in FIG. 6O, a ceramic layer 436 may be formed over and/or on the oxide layer 432. A metal layer 438 may be formed over and/or on the ceramic layer 436. The ceramic layer 436 and the metal layer 438 may fill in the recesses 606 to form the light-blocking structure 444. The deposition tool 102 and/or the plating tool 112 may deposit the ceramic layer 436 and/or the metal layer 438 in a CVD operation, a PVD operation, an ALD operation, an electroplating operation, another deposition operation described above in connection with FIG. 1, and/or another suitable deposition operation. In some implementations, a seed layer is first deposited, the metal layer 438 is deposited on the seed layer. In some implementations, the planarization tool 110 planarizes the ceramic layer 436 and/or the metal layer 438 after the deposition tool 102 and/or the plating tool 112 deposits the ceramic layer 436 and/or the metal layer 438.

As shown in FIG. 6P, an oxide layer 440 may be formed over and/or on the metal layer 438. The deposition tool 102 may deposit the oxide layer 440 in a CVD operation, a PVD operation, an ALD operation, another deposition operation described above in connection with FIG. 1, and/or another suitable deposition operation. In some implementations, the planarization tool 110 planarizes the oxide layer 440 after the deposition tool 102 deposits the oxide layer 440.

As shown in FIG. 6Q, portions of the oxide layer 432, portions of the ceramic layer 436, portions of the metal layer 438, and/or portions of the oxide layer 440 may be removed in the pixel sensor array 316 to form a grid structure 434 over the pixel sensors 200. In some implementations, a pattern in a photoresist layer is used to etch the oxide layer 432, the ceramic layer 436, the metal layer 438, and/or the oxide layer 440 to form the grid structure 434. In these implementations, the deposition tool 102 forms the photoresist layer on the oxide layer 440. The exposure tool 104 exposes the photoresist layer to a radiation source to pattern the photoresist layer. The developer tool 106 develops and removes portions of the photoresist layer to expose the pattern. The etch tool 108 etches the oxide layer 432, the ceramic layer 436, the metal layer 438, and/or the oxide layer 440 based on the pattern to form the grid structure 434. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the oxide layer 432, the ceramic layer 436, the metal layer 438, and/or the oxide layer 440 based on a pattern.

As further shown in FIG. 6Q, portions of the oxide layer 432, portions of the ceramic layer 436, portions of the metal layer 438, and/or portions of the oxide layer 440 may be removed in the bonding pad region 418. Moreover, a portion of the dielectric plug 448 may be removed to expose the bonding pad 446 through the dielectric plug 448. This enables an electrical connection to be formed to the bonding pad 446.

As shown in FIG. 6R, a buffer oxide layer 442 may be formed over and/or on the oxide layer 440 and over and/or on the dielectric plug 448. The deposition tool 102 may deposit the buffer oxide layer 442 in a CVD operation, a PVD operation, an ALD operation, another deposition operation described above in connection with FIG. 1, and/or another suitable deposition operation. In some implementations, the planarization tool 110 planarizes the buffer oxide layer 442 after the deposition tool 102 deposits the buffer oxide layer 442.

As indicated above, FIGS. 6A-6R are provided as an example. Other examples may differ from what is described with regard to FIGS. 6A-6R.

Figure 7:
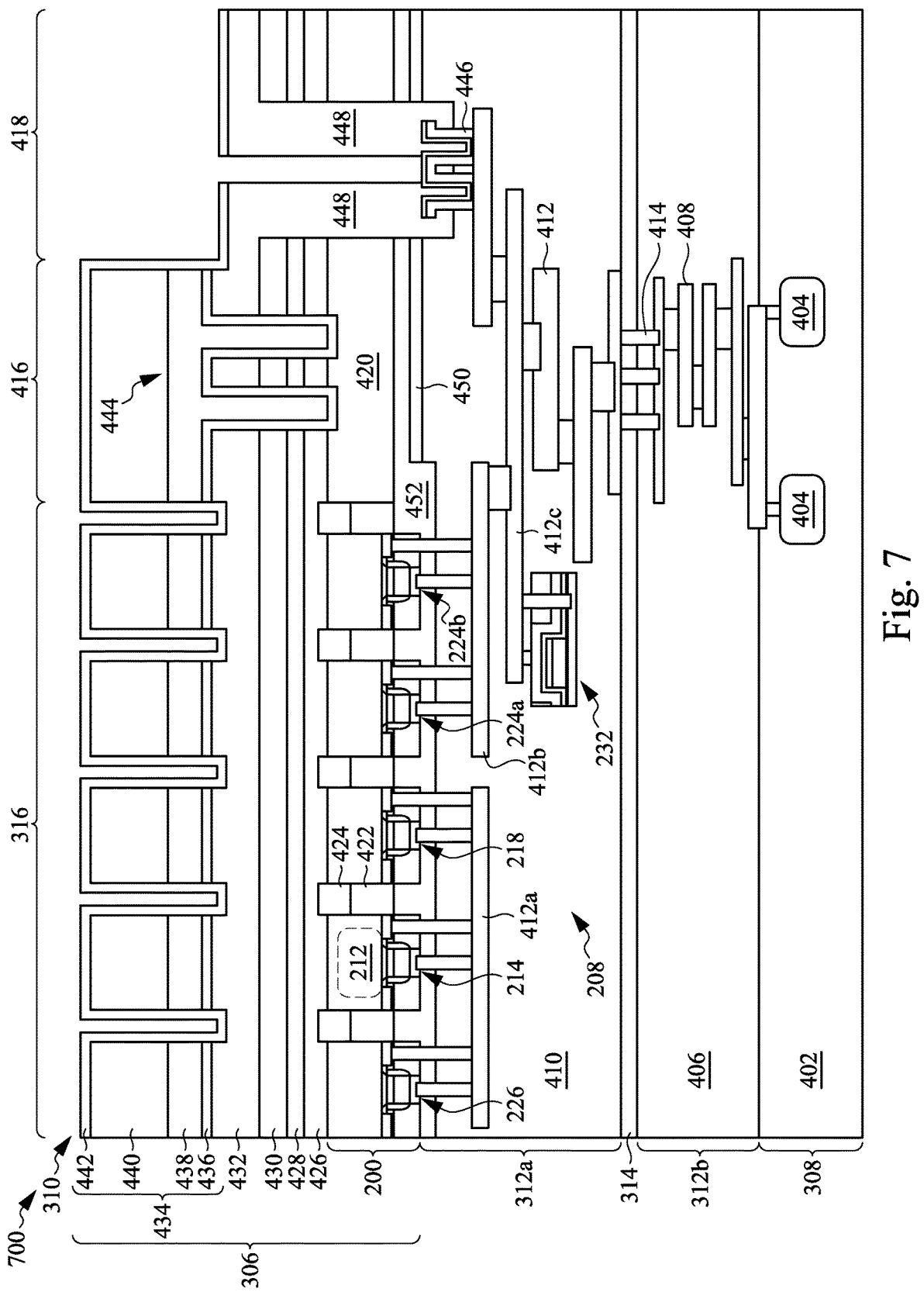
FIG. 7 is a diagram of an example implementation of an image sensor device described herein.

FIG. 7 is a diagram of an example implementation 700 of an image sensor device 310 described herein. FIG. 7 illustrates a cross-sectional view of the example implementation 700 of the image sensor device 310. In the example implementation 700, a capacitor 232 may be electrically connected to a different metallization layer than the metallization layer to which the source follower transistors 224a and 224b are electrically connected. This enables flexible placement of the capacitor 232 in the sensor die 306, which may further enable the size and/or quantity of the source follower transistors 224a and 224b to be increased.

As shown in FIG. 7, in the example implementation 700, the image sensor device 310 may include a similar configuration of device and/or layers as the image sensor device 310 in the example implementation 400 of FIG. 4. For example, in the example implementation 700, the image sensor device 310 may include a sensor die 306 and a circuitry die 308 bonded with the sensor die at bonding interface 314. The sensor die 306 includes a pixel sensor 200 that includes a sensing region 206 that includes a photodiode 212 in a device region 420 of the sensor die 306. The pixel sensor 200 may include a control circuitry region 208, below the device region 420, that includes a transfer gate transistor 214, a reset gate transistor 218 electrically connected with the transfer gate transistor 214, a plurality of source follower transistors 224a, 224b electrically connected with the transfer gate transistor 214 and the reset gate transistor 218, a capacitor 232 electrically connected with the plurality of source follower transistors 224a, 224b, and a row select transistor 226 electrically connected with the capacitor 232. The capacitor 232 may be configured to store a photocurrent 210 received from the plurality of source follower transistors 224a, 224b.

As further shown in FIG. 7, the capacitor 232 may be included in a BEOL region 312a of the sensor die 306. In the example implementation 700 of the image sensor device 310, the capacitor 232 and the plurality of source follower transistors 224a, 224b may be electrically connected with different metallization layers. For example, the plurality of source follower transistors 224a, 224b may be electrically connected with the metallization layer 412b in the BEOL region 312a of the sensor die 306, and the capacitor 232 may be electrically connected with a metallization layer 412c in the BEOL region 312a of the sensor die 306. This may enable more flexible placement of the capacitor 232 in the BEOL region 312a, which may further enable the size and/or quantity of the source follower transistors 224a and 224b to be increased. Moreover, this may enable the placement of the capacitor 232 to be selected to accommodate other devices and/or structures in the BEOL region 312a.

As further shown in FIG. 7, in the example implementation 700, the image sensor device 310 may include a similar arrangement of elements 402-452 as the image sensor device 310 in the example implementation 400.

As indicated above, FIG. 7 is provided as an example. Other examples may differ from what is described with regard to FIG. 7.

Figure 8:
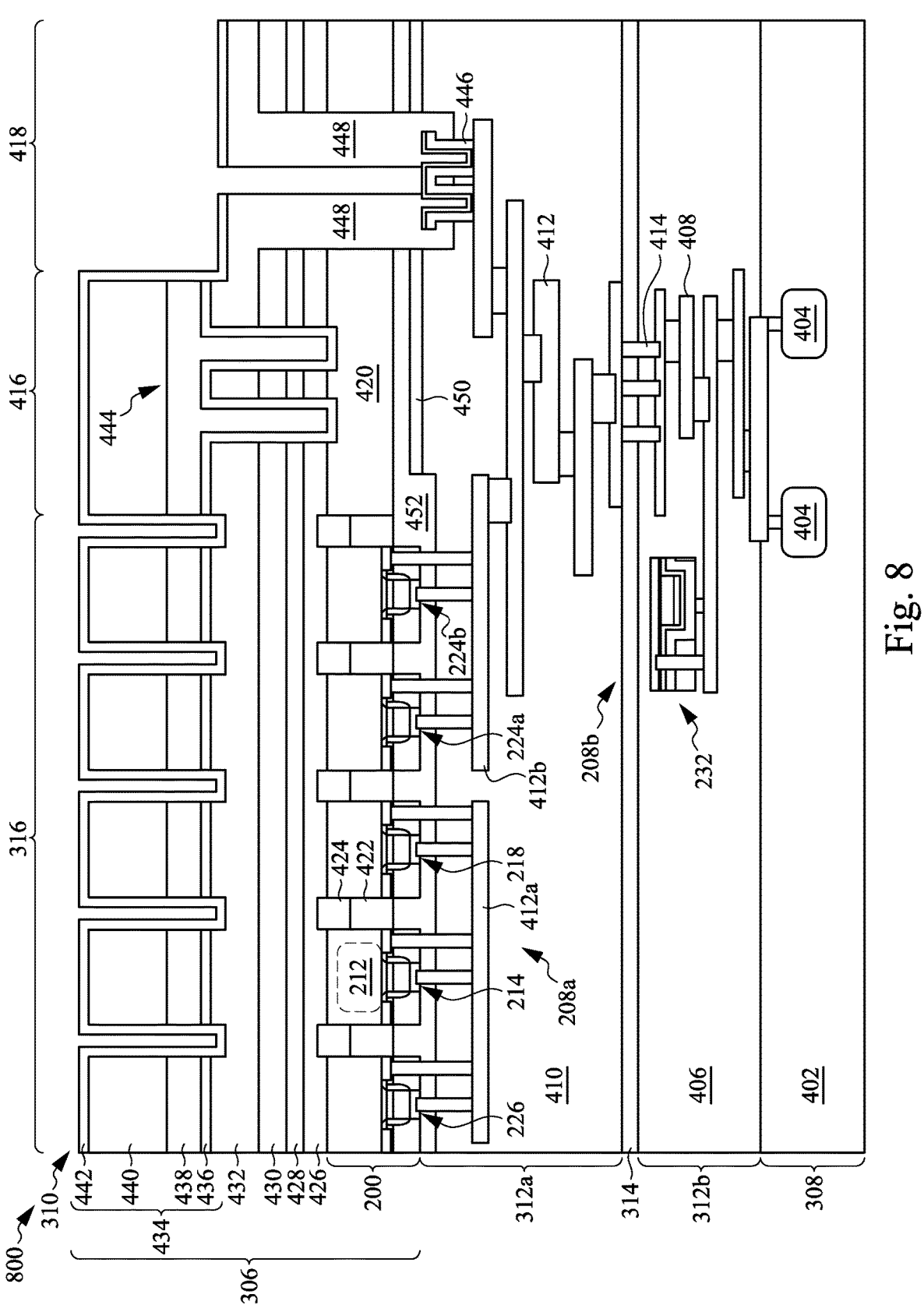
FIG. 8 is a diagram of an example implementation of an image sensor device described herein.

FIG. 8 is a diagram of an example implementation 800 of an image sensor device 310 described herein. FIG. 8 illustrates a cross-sectional view of the example implementation 800 of the image sensor device 310. In the example implementation 800, a capacitor 232 may be included in the circuitry die 308 instead of (or addition to) including the capacitor 232 in the sensor die 306. This may free up space in the sensor die 306 to further increase size and/or quantity of the source follower transistors 224a and 224b.

As shown in FIG. 8, in the example implementation 800, the image sensor device 310 may include a similar configuration of device and/or layers as the image sensor device 310 in the example implementation 400 of FIG. 4. For example, in the example implementation 800, the image sensor device 310 may include a sensor die 306 and a circuitry die 308 bonded with the sensor die 306 at bonding interface 314. The sensor die 306 includes a pixel sensor 200 that includes a sensing region 206 that includes a photodiode 212 in a device region 420 of the sensor die 306. The pixel sensor 200 may include a first control circuitry region 208a, below the device region 420, that includes a transfer gate transistor 214, a reset gate transistor 218 electrically connected with the transfer gate transistor 214, a plurality of source follower transistors 224a, 224b electrically connected with the transfer gate transistor 214 and the reset gate transistor 218, and a row select transistor 226.

As further shown in FIG. 8, in the example implementation 800, the image sensor device 310 may include a capacitor 232 in the BEOL region 312b of the circuitry die 308. This may free up space in the sensor die 306 to further increase size and/or quantity of the source follower transistors 224a and 224b in the sensor die 306. The capacitor 232 may be included in a second control circuitry region 208b associated with the pixel sensor 200, and may be electrically connected with a metallization layer 408 in the BEOL region 312b. The capacitor 232 may be electrically connected with the plurality of source follower transistors 224a, 224b and the row select transistor 226 through the metallization layers 408, the metallization layers 412, and the bonding contacts 414. The capacitor 232 may be configured to store a photocurrent 210 received from the plurality of source follower transistors 224a, 224b.

As further shown in FIG. 8, in the example implementation 800, the image sensor device 310 may include a similar arrangement of elements 402-452 as the image sensor device 310 in the example implementation 400.

As indicated above, FIG. 8 is provided as an example. Other examples may differ from what is described with regard to FIG. 8.

Figure 9:
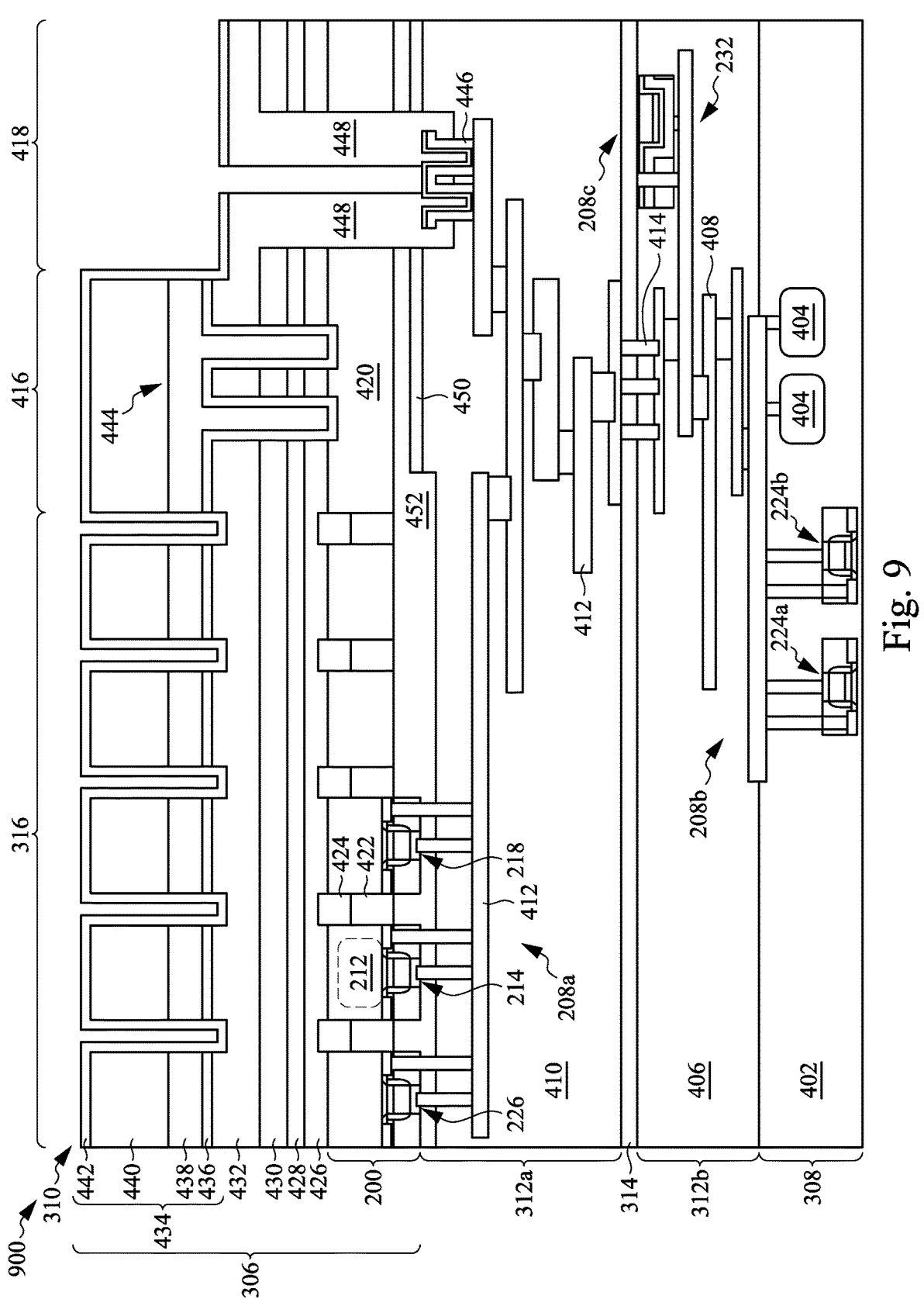
FIG. 9 is a diagram of an example implementation of an image sensor device described herein.

FIG. 9 is a diagram of an example implementation 900 of an image sensor device 310 described herein. FIG. 9 illustrates a cross-sectional view of the example implementation 900 of the image sensor device 310. In the example implementation 900, a plurality of source follower transistors 224a, 224b and a capacitor 232 may be included in the circuitry die 308 instead of (or addition to) including the plurality of source follower transistors 224a, 224b and the capacitor 232 in the sensor die 306. Including the source follower transistors 224a and 224b in the circuitry die 308 (e.g., in the device region 402 of the circuitry die 308) may provide a greater amount of area for the source follower transistors 224a and 224b relative to including the source follower transistors 224a and 224b in the sensor die 306. The increased area for the source follower transistors 224a and 224b in the circuitry die 308 may further enable the size and/or quantity of the source follower transistors 224a and 224b to be increased. Moreover, including the source follower transistors 224a and 224b in the circuitry die 308 may provide additional area in the sensor die 306 for other devices and/or layers in the sensor die 306.

As shown in FIG. 9, in the example implementation 900, the image sensor device 310 may include a similar configuration of device and/or layers as the image sensor device 310 in the example implementation 400 of FIG. 4. For example, in the example implementation 900, the image sensor device 310 may include a sensor die 306 and a circuitry die 308 bonded with the sensor die at bonding interface 314. The sensor die 306 includes a pixel sensor 200 that includes a sensing region 206 that includes a photodiode 212 in a device region 420 of the sensor die 306. The pixel sensor 200 may include a first control circuitry region 208a, below the device region 420, that includes a transfer gate transistor 214, a reset gate transistor 218 electrically connected with the transfer gate transistor 214, and a row select transistor 226.

As further shown in FIG. 9, in the example implementation 900, a plurality of source follower transistors 224a, 224b may be included in a second control circuitry region 208b in the circuitry die 308. The source follower transistors 224a and 224b may be electrically connected with a metallization layer 408 in the BEOL region 312b of the circuitry die 308. The source follower transistors 224a and 224b may be electrically connected with the transfer gate transistor 214 and the reset gate transistor 218 through the metallization layers 408, the metallization layers 412, and the bonding contacts 414. Including the source follower transistors 224a and 224b in the circuitry die 308 (e.g., in the device region 402 of the circuitry die 308) may provide a greater amount of area for the source follower transistors 224a and 224b relative to including the source follower transistors 224a and 224b in the sensor die 306. The increased area for the source follower transistors 224a and 224b in the circuitry die 308 may further enable the size and/or quantity of the source follower transistors 224a and 224b to be increased.

As further shown in FIG. 9, in the example implementation 900, the image sensor device 310 may include a capacitor 232 in the BEOL region 312b of the circuitry die 308. The capacitor 232 may be included in a third control circuitry region 208c associated with the pixel sensor 200, and may be electrically connected with a metallization layer 408 in the BEOL region 312b. The capacitor 232 may be electrically connected with the plurality of source follower transistors 224a, 224b through the metallization layers 408. The capacitor 232 may be electrically connected with the row select transistor 226 through the metallization layers 408, the metallization layers 412, and the bonding contacts 414. The capacitor 232 may be configured to store a photocurrent 210 received from the plurality of source follower transistors 224a, 224b.

As further shown in FIG. 9, in the example implementation 900, the image sensor device 310 may include a similar arrangement of elements 402-452 as the image sensor device 310 in the example implementation 400.

As indicated above, FIG. 9 is provided as an example. Other examples may differ from what is described with regard to FIG. 9.

Figure 10:
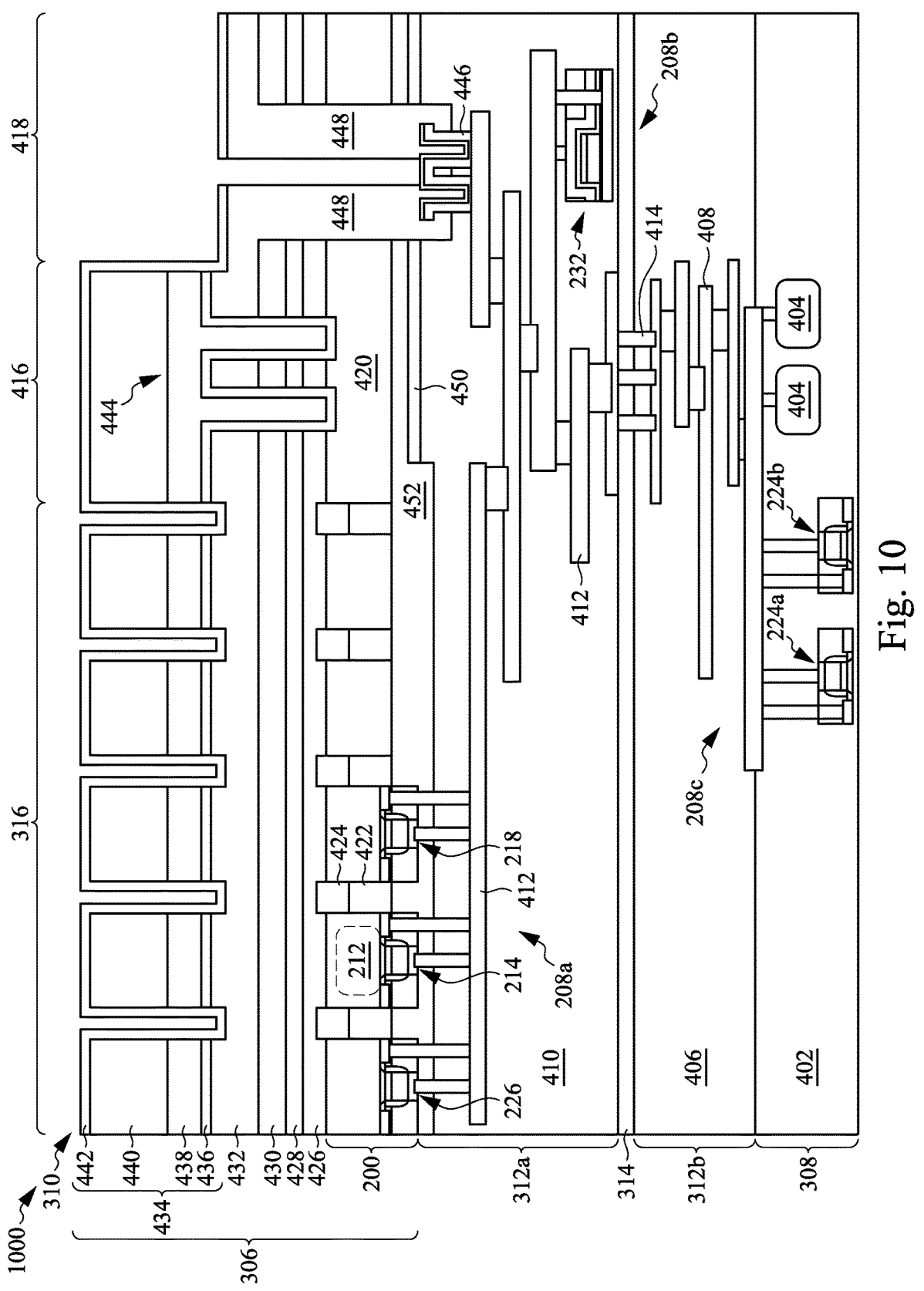
FIG. 10 is a diagram of an example implementation of an image sensor device described herein.

FIG. 10 is a diagram of an example implementation 1000 of an image sensor device 310 described herein. FIG. 10 illustrates a cross-sectional view of the example implementation 1000 of the image sensor device 310. In the example implementation 1000, a plurality of source follower transistors 224a, 224b may be included in the circuitry die 308 instead of (or addition to) including the plurality of source follower transistors 224a, 224b in the sensor die 306. A capacitor 232 may be included in the sensor die 306. Including the source follower transistors 224a and 224b in the circuitry die 308, and including the capacitor 232 in the sensor die 306, may provide a greater amount of area for the source follower transistors 224a and 224b relative to including the source follower transistors 224a and 224b in the sensor die 306. The increased area for the source follower transistors 224a and 224b in the circuitry die 308 may further enable the size and/or quantity of the source follower transistors 224a and 224b to be increased. Moreover, including the source follower transistors 224a and 224b in the circuitry die 308 may provide additional area in the sensor die 306 for other devices and/or layers in the sensor die 306.

As shown in FIG. 10, in the example implementation 1000, the image sensor device 310 may include a similar configuration of device and/or layers as the image sensor device 310 in the example implementation 400 of FIG. 4. For example, in the example implementation 1000, the image sensor device 310 may include a sensor die 306 and a circuitry die 308 bonded with the sensor die at bonding interface 314. The sensor die 306 includes a pixel sensor 200 that includes a sensing region 206 that includes a photodiode 212 in a device region 420 of the sensor die 306. The pixel sensor 200 may include a first control circuitry region 208a, below the device region 420, that includes a transfer gate transistor 214, a reset gate transistor 218 electrically connected with the transfer gate transistor 214, and a row select transistor 226. A second control circuitry region 208b may be included in the in the sensor die 306, in which a capacitor 232 is included. The capacitor 232 may be electrically connected with a metallization layer 412 in the BEOL region 312a of the sensor die 306. The capacitor 232 may be electrically connected with the row select transistor 226 through the metallization layers 412.

As further shown in FIG. 10, in the example implementation 1000, a plurality of source follower transistors 224a, 224b may be included in a third control circuitry region 208c in the circuitry die 308. The source follower transistors 224a and 224b may be electrically connected with a metallization layer 408 in the BEOL region 312b of the circuitry die 308. The source follower transistors 224a and 224b may be electrically connected with the transfer gate transistor 214, the reset gate transistor 218, and the capacitor 232 through the metallization layers 408, the metallization layers 412, and the bonding contacts 414. Including the source follower transistors 224a and 224b in the circuitry die 308 (e.g., in the device region 402 of the circuitry die 308) may provide a greater amount of area for the source follower transistors 224a and 224b relative to including the source follower transistors 224a and 224b in the sensor die 306. The increased area for the source follower transistors 224a and 224b in the circuitry die 308 may further enable the size and/or quantity of the source follower transistors 224a and 224b to be increased.

As further shown in FIG. 10, in the example implementation 1000, the image sensor device 310 may include a similar arrangement of elements 402-452 as the image sensor device 310 in the example implementation 400.

As indicated above, FIG. 10 is provided as an example. Other examples may differ from what is described with regard to FIG. 10.

Figure 11:
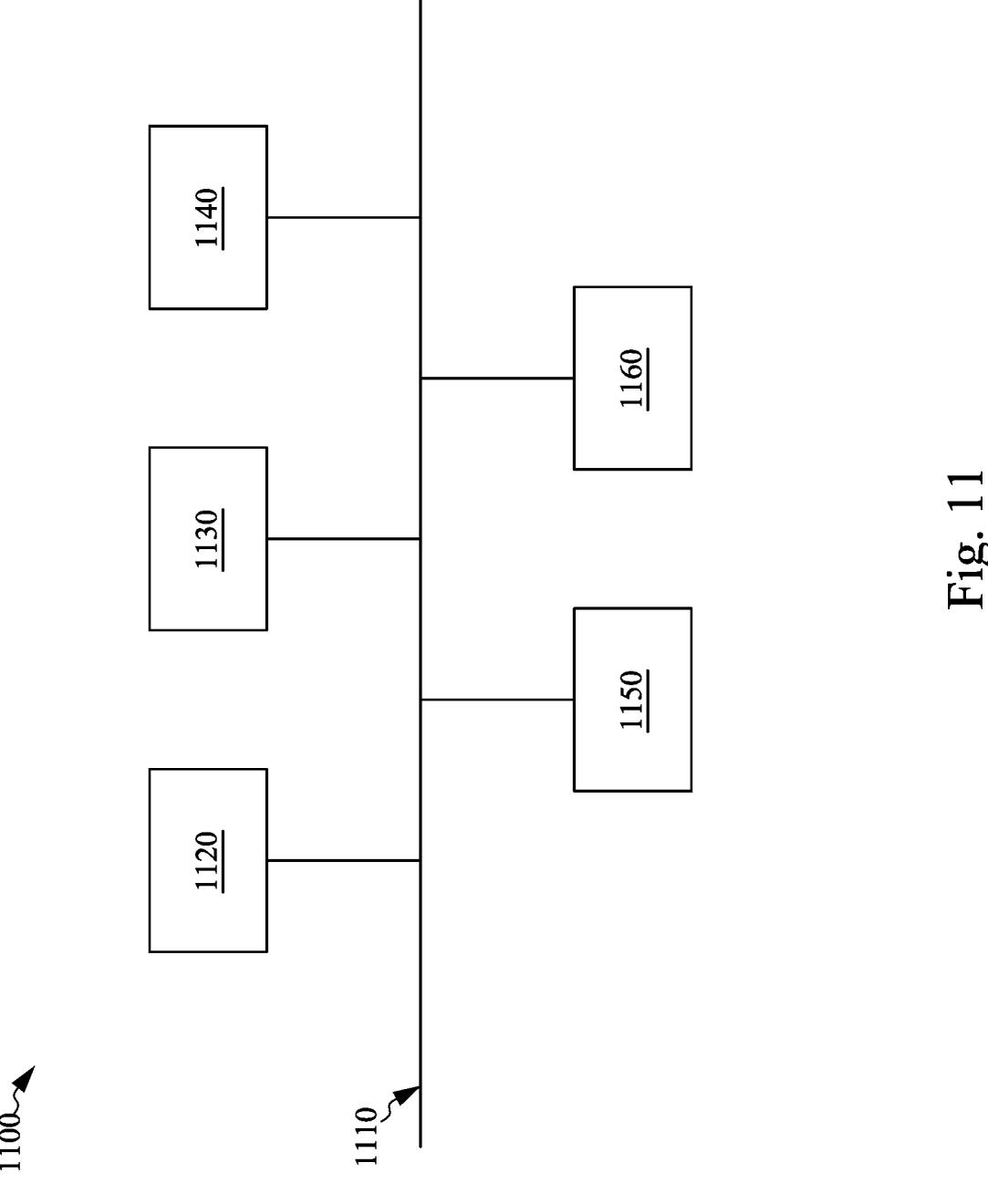
FIG. 11 is a diagram of example components of a device described herein.

FIG. 11 is a diagram of example components of a device 1100 described herein. In some implementations, one or more of the semiconductor processing tools 102-116 and/or the wafer/die transport tool 118 may include one or more devices 1100 and/or one or more components of the device 1100. As shown in FIG. 11, the device 1100 may include a bus 1110, a processor 1120, a memory 1130, an input component 1140, an output component 1150, and/or a communication component 1160.

The bus 1110 may include one or more components that enable wired and/or wireless communication among the components of the device 1100. The bus 1110 may couple together two or more components of FIG. 11, such as via operative coupling, communicative coupling, electronic coupling, and/or electric coupling. For example, the bus 1110 may include an electrical connection (e.g., a wire, a trace, and/or a lead) and/or a wireless bus. The processor 1120 may include a central processing unit, a graphics processing unit, a microprocessor, a controller, a microcontroller, a digital signal processor, a field-programmable gate array, an application-specific integrated circuit, and/or another type of processing component. The processor 1120 may be implemented in hardware, firmware, or a combination of hardware and software. In some implementations, the processor 1120 may include one or more processors capable of being programmed to perform one or more operations or processes described elsewhere herein.

The memory 1130 may include volatile and/or nonvolatile memory. For example, the memory 1130 may include random access memory (RAM), read only memory (ROM), a hard disk drive, and/or another type of memory (e.g., a flash memory, a magnetic memory, and/or an optical memory). The memory 1130 may include internal memory (e.g., RAM, ROM, or a hard disk drive) and/or removable memory (e.g., removable via a universal serial bus connection). The memory 1130 may be a non-transitory computer-readable medium. The memory 1130 may store information, one or more instructions, and/or software (e.g., one or more software applications) related to the operation of the device 1100. In some implementations, the memory 1130 may include one or more memories that are coupled (e.g., communicatively coupled) to one or more processors (e.g., processor 1120), such as via the bus 1110. Communicative coupling between a processor 1120 and a memory 1130 may enable the processor 1120 to read and/or process information stored in the memory 1130 and/or to store information in the memory 1130.

The input component 1140 may enable the device 1100 to receive input, such as user input and/or sensed input. For example, the input component 1140 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 1150 may enable the device 1100 to provide output, such as via a display, a speaker, and/or a light-emitting diode. The communication component 1160 may enable the device 1100 to communicate with other devices via a wired connection and/or a wireless connection. For example, the communication component 1160 may include a receiver, a transmitter, a transceiver, a modem, a network interface card, and/or an antenna.

The device 1100 may perform one or more operations or processes described herein. For example, a non-transitory computer-readable medium (e.g., memory 1130) may store a set of instructions (e.g., one or more instructions or code) for execution by the processor 1120. The processor 1120 may execute the set of instructions to perform one or more operations or processes described herein. In some implementations, execution of the set of instructions, by one or more processors 1120, causes the one or more processors 1120 and/or the device 1100 to perform one or more operations or processes described herein. In some implementations, hardwired circuitry may be used instead of or in combination with the instructions to perform one or more operations or processes described herein. Additionally, or alternatively, the processor 1120 may be configured to perform one or more operations or processes described herein. Thus, implementations described herein are not limited to any specific combination of hardware circuitry and software.

The number and arrangement of components shown in FIG. 11 are provided as an example. The device 1100 may include additional components, fewer components, different components, or differently arranged components than those shown in FIG. 11. Additionally, or alternatively, a set of components (e.g., one or more components) of the device 1100 may perform one or more functions described as being performed by another set of components of the device 1100.

FIG. 12 is a flowchart of an example process 1200 associated with forming an image sensor device. In some implementations, one or more process blocks of FIG. 12 are performed by one or more semiconductor processing tools (e.g., one or more of the semiconductor processing tools 102-116). Additionally, or alternatively, one or more process blocks of FIG. 12 may be performed by one or more components of device 1100, such as processor 1120, memory 1130, input component 1140, output component 1150, and/or communication component 1160.

As shown in FIG. 12, process 1200 may include forming, in a sensor die, a photodiode in a sensing region of a pixel sensor included in a pixel sensor array, a transfer gate transistor electrically connected with the photodiode, a reset gate transistor electrically connected with the transfer gate transistor, and a row select transistor (block 1210). For example, one or more of the semiconductor processing tools 102-116 may form, in a sensor die 306, a photodiode 212 in a sensing region 206 of a pixel sensor 200 included in a pixel sensor array 316, a transfer gate transistor 214 electrically connected with the photodiode 212, a reset gate transistor 218 electrically connected with the transfer gate transistor 214, and a row select transistor 226, as described herein.

As further shown in FIG. 12, process 1200 may include forming, in at least one of the sensor die or a circuitry die, a plurality of source follower transistors associated with the pixel sensor (block 1220). For example, one or more of the semiconductor processing tools 102-116 may form, in at least one of the sensor die 306 or a circuitry die 308, a plurality of source follower transistors 224 (e.g., a source follower transistor 224a, a source follower transistor 224b), associated with the pixel sensor 200, as described herein.

As further shown in FIG. 12, process 1200 may include forming a capacitor in at least one of the sensor die or the circuitry die (block 1230). For example, one or more of the semiconductor processing tools 102-116 may form a capacitor 232 in at least one of the sensor die 306 or the circuitry die 308, as described herein. In some implementations, the capacitor 232 is electrically connected with the row select transistor 226 and the plurality of source follower transistors.

As further shown in FIG. 12, process 1200 may include bonding the sensor die and the circuitry die (block 1240). For example, one or more of the semiconductor processing tools 102-116 may bond the sensor die 306 and the circuitry die 308, as described herein.

Process 1200 may include additional implementations, such as any single implementation or any combination of implementations described below and/or in connection with one or more other processes described elsewhere herein.

In a first implementation, forming the capacitor 232 in the sensor die 306 includes forming the capacitor 232 in a control circuitry region 208 below a sensing region 206 in which the photodiode 212 is included, and wherein forming the transfer gate transistor, the reset gate transistor, the plurality of source follower transistors, and the row select transistor includes forming the transfer gate transistor, the reset gate transistor, the plurality of source follower transistors, and the row select transistor in the control circuitry region 208 (e.g., the same control circuitry region as the capacitor 232).

In a second implementation, alone or in combination with the first implementation, forming the capacitor 232 includes forming the capacitor 232 such that the plurality of source follower transistors and the capacitor 232 are electrically connected with a same metallization layer 412b in the BEOL region 312a of the sensor die 306.

In a third implementation, alone or in combination with one or more of the first or second implementations, the plurality of source follower transistors are electrically connected with a first metallization layer 412b in the BEOL region 312a of the sensor die 306, and forming the capacitor

232 includes forming the capacitor 232 such that the capacitor 232 is electrically connected with a second metallization layer 412c in the BEOL region 312a of the sensor die 306, where the second metallization layer 412c is below the first metallization layer 412b in the BEOL region 312a.

In a fourth implementation, alone or in combination with one or more of the first through third implementations, forming the transfer gate transistor 214 includes forming the transfer gate transistor 214 in a first control circuitry region 208a, forming the reset gate transistor 218 includes forming the reset gate transistor 218 in the first control circuitry region 208a, forming the row select transistor 226 includes forming the row select transistor 226 in a first control circuitry region 208a, and forming the plurality of source follower transistors includes forming the plurality of source follower transistors in a second control circuitry region 208b in the sensor die 306.

In a fifth implementation, alone or in combination with one or more of the first through fourth implementations, forming the capacitor 232 includes forming the capacitor 232 in the sensor die 306.

In a sixth implementation, alone or in combination with one or more of the first through fifth implementations, forming the capacitor 232 in the sensor die 306 includes forming the capacitor 232 in a BEOL region 312a of the sensor die 306.

In a seventh implementation, alone or in combination with one or more of the first through sixth implementations, forming the capacitor 232 includes forming the capacitor 232 in the circuitry die 308.

In an eighth implementation, alone or in combination with one or more of the first through seventh implementations, forming the capacitor 232 in the circuitry die 308 includes forming the capacitor 232 in a BEOL region 312b of the circuitry die 308.

In a ninth implementation, alone or in combination with one or more of the first through eight implementations, process 1200 includes forming, after bonding the sensor die 306 and the circuitry die 308, a recess 604 that extends through a device region 420 of the sensor die 306 and into a BEOL region 312a of the sensor die 306, forming a bonding pad 446 in the recess 604, where the bonding pad 446 is electrically connected with a metallization layer 412 in the BEOL region 312a, and forming a dielectric plug 448 over the bonding pad 446 in the recess 604.

In a tenth implementation, alone or in combination with one or more of the first through ninth implementations, forming the bonding pad 446 includes forming the bonding pad 446 in the recess 604 such that a top surface of the bonding pad 446 is below a bottom surface of the device region 420.

In an eleventh implementation, alone or in combination with one or more of the first through tenth implementations, forming the transfer gate transistor 214 includes forming the transfer gate transistor 214 in a first control circuitry region 208a in the sensor die 306, forming the reset gate transistor 218 includes forming the reset gate transistor 218 in the first control circuitry region 208a in the sensor die 306, forming the row select transistor 226 includes forming the row select transistor 226 in a first control circuitry region 208a in the sensor die 306, forming the plurality of source follower transistors includes forming the plurality of source follower transistors in the first control circuitry region 208a in the sensor die 306, and forming the capacitor includes forming the capacitor 232 in a second control circuitry region 208b in the circuitry die 308.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

In this way, an image sensor device may include a pixel sensor array that includes a plurality of pixel sensors. Under the pixel sensors, a plurality of transistors may be included and electrically connected with a back end of line (BEOL) region of the image sensor device. The image sensor device may further include a bonding pad region in which a bonding pad is included. A dielectric plug may surround a portion of the bonding pad and may fully extend through a semiconductor device region to provide electrical, thermal, and/or optical isolation for the pixel sensors of the pixel sensor array. The inclusion of the dielectric plug may provide increased electrical, thermal, and/or optical isolation while occupying a smaller lateral area. The smaller lateral area of the dielectric plug enables a greater amount of lateral area in the semiconductor device region to be used for the transistors of the pixel sensors of the image sensor device. This enables one or more of the transistors to be formed to a greater size, which may enabled greater performance to be achieved for the one or more transistors. Additionally and/or alternatively, one or more capacitors in the BEOL region of the image sensor device. The one or more capacitors may enable a photocurrent generated by one or more of the pixel sensors to be directly transferred from the one or more source follower transistors to the one or more capacitors for storage, which may enable advance shutter operations for the image sensor device.

As described in greater detail above, some implementations described herein provide an image sensor device. The image sensor device includes a sensor die. The image sensor device includes a circuitry die bonded with the sensor die at a bonding interface. The sensor die includes a pixel sensor that includes a sensing region that includes a photodiode in a device region of the sensor die. The pixel sensor includes a control circuitry region below the sensing region, that includes a transfer gate transistor, a reset gate transistor electrically connected with the transfer gate transistor, a plurality of source follower transistors electrically connected with the transfer gate transistor and the reset gate transistor, a capacitor electrically connected with the plurality of source follower transistors, and a row select transistor electrically connected with the capacitor As described in greater detail above, some implementations described herein provide a method. The method includes forming, in a sensor die, a photodiode in a sensing region of a pixel sensor included in a pixel sensor array. The method includes forming, in the sensor die, a transfer gate transistor included in a first control circuitry region of the sensor die and electrically connected with the photodiode. The method includes forming, in the sensor die, a reset gate transistor included in the first control circuitry region and electrically connected with the transfer gate transistor. The method includes forming, in the sensor die, a row select transistor included in the first control circuitry region. The method includes forming, in a circuitry die, a plurality of source follower transistors included in a second control circuitry region associated with the pixel sensor. The method includes forming a capacitor in at least one of the sensor die or the circuitry die, where the capacitor is electrical connected with the row select transistor and the plurality of source follower transistors. The method includes bonding the sensor die and the circuitry die.

As described in greater detail above, some implementations described herein provide an image sensor device. The image sensor device includes a sensor die that includes a pixel sensor. The pixel sensor includes a sensing region that includes a photodiode in a device region of the sensor die. The pixel sensor includes a first control circuitry region below the sensing region. The first control circuitry region includes a transfer gate transistor, a reset gate transistor electrically connected with the transfer gate transistor, a plurality of source follower transistors electrically connected with the transfer gate transistor and the reset gate transistor, and a row select transistor. The image sensor device includes a circuitry die, bonded with the sensor die at a bonding interface, that includes a second control circuitry region. The second control circuitry region includes a capacitor electrically connected with the plurality of source follower transistors and the row select transistor, where the capacitor is configured to store a photocurrent received from the plurality of source follower transistors.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
a sensor die; and
a circuitry die bonded with the sensor die at a bonding interface,
wherein the sensor die includes a pixel sensor comprising:
a sensing region that includes a photodiode in a device region of the sensor die; and
a control circuitry region below the device region, comprising:
a transfer gate transistor;
a reset gate transistor electrically connected with the transfer gate transistor;
a plurality of source follower transistors electrically connected with the transfer gate transistor and the reset gate transistor;
a capacitor electrically connected with the plurality of source follower transistors;
a row select transistor electrically connected with the capacitor;
a bonding pad that is electrically connected with a metallization layer in a back end of line (BEOL) region of the sensor die; and
a dielectric plug that extends through the device region into one or more dielectric layers of the BEOL region under the device region,
wherein the dielectric plug is formed on at least two sides of the bonding pad.

2. The image sensor device of claim 1, wherein the capacitor is configured to store a photocurrent received from the plurality of source follower transistors.

3. The image sensor device of claim 1, wherein the capacitor is included in the BEOL region of the sensor die.

4. The image sensor device of claim 3, wherein the plurality of source follower transistors and the capacitor are electrically connected with a same metallization layer in the BEOL region of the sensor die.

5. The image sensor device of claim 3, wherein the plurality of source follower transistors are electrically connected with a first metallization layer in the BEOL region of the sensor die;

wherein the capacitor is electrically connected with a second metallization layer in the BEOL region of the sensor die; and wherein the second metallization layer is below the first metallization layer in the BEOL region.

6. The image sensor device of claim 1, wherein the sensor die further comprises:

a black level correction (BLC) region adjacent to the pixel sensor; and a bonding pad region, adjacent to the BLC region, comprising the bonding pad, wherein a top surface of the bonding pad is below the device region of the sensor die.

7. A method, comprising:

forming, in a sensor die:

a photodiode in a sensing region of a pixel sensor included in a pixel sensor array;

a transfer gate transistor, included in a first control circuitry region of the sensor die, electrically connected with the photodiode;

a reset gate transistor, included in the first control circuitry region, electrically connected with the transfer gate transistor; and a row select transistor included in the first control circuitry region;

forming, in a circuitry die:

a plurality of source follower transistors included in a second control circuitry region associated with the pixel sensor;

forming a capacitor in at least one of the sensor die or the circuitry die, wherein the capacitor is electrical connected with the row select transistor and the plurality of source follower transistors;

bonding the sensor die and the circuitry die;

forming a recess that extends through a device region of the sensor die and into one or more dielectric layers of a back end of line (BEOL) region of the sensor die under the device region;

forming a bonding pad in the recess; and forming a dielectric plug over the bonding pad in the recess, wherein the dielectric plug is formed on at least two sides of the bonding pad.

8. The method of claim 7, wherein forming the capacitor comprises:

forming the capacitor in the sensor die.

9. The method of claim 8, wherein forming the capacitor in the sensor die comprises:

forming the capacitor in the BEOL region of the sensor die, wherein the capacitor is included in a third control circuitry region, associated with the pixel sensor, in the BEOL region.

10. The method of claim 7, wherein forming the capacitor comprises:

forming the capacitor in the circuitry die.

11. The method of claim 10, wherein forming the capacitor in the circuitry die comprises:

forming the capacitor in a back end of line (BEOL) region of the circuitry die.

12. The method of claim 7, wherein forming the bonding pad comprises:

forming the bonding pad in the recess such that a top surface of the bonding pad is below a bottom surface of the device region.

13. An image sensor device, comprising:

a sensor die, comprising:

a pixel sensor comprising:

a sensing region that includes a photodiode in a device region of the sensor die;

a first control circuitry region below the sensing region, comprising:

a transfer gate transistor;

a reset gate transistor electrically connected with the transfer gate transistor;

a plurality of source follower transistors electrically connected with the transfer gate transistor and the reset gate transistor; and a row select transistor;

a p-type implant region at least partially surrounding the photodiode; and a deep trench isolation (DTI) structure, above the p-type implant region, at least partially surrounding the photodiode; and a circuitry die, bonded with the sensor die at a bonding interface, comprising:

a second control circuitry region, comprising:

a capacitor electrically connected with the plurality of source follower transistors and the row select transistor, wherein the capacitor is configured to store a photocurrent received from the plurality of source follower transistors.

14. The image sensor device of claim 13, wherein the capacitor is included in a back end of line (BEOL) region of the circuitry die.

15. The image sensor device of claim 13, wherein the capacitor is located vertically below the plurality of source follower transistors.

16. The image sensor device of claim 13, wherein the sensor die further comprises:

a black level correction (BLC) region adjacent to the pixel sensor; and a bonding pad region, adjacent to the BLC region, comprising:

a bonding pad that is electrically connected with a metallization layer in a back end of line (BEOL) region of the sensor die, wherein a top surface of the bonding pad is below the device region of the sensor die.

17. The image sensor device of claim 16, wherein the sensor die further comprises:

a dielectric plug, in the bonding pad region, that extends through the device region.

18. The image sensor device of claim 1, wherein the dielectric plug is formed on more than two sides of the bonding pad.

19. The image sensor device of claim 1, wherein the dielectric plug extends through at least one dielectric layer over the device region.

20. The method of claim 7, wherein the dielectric plug is formed on more than two sides of the bonding pad.

\* \* \* \* \*